US012787324B2

(12) United States Patent
Kato et al.

(10) Patent No.: US 12,787,324 B2
(45) Date of Patent: Nov. 3, 2026

(54) SEMICONDUCTOR ELEMENT, SEMICONDUCTOR INTEGRATED CIRCUIT, AND PRODUCTION METHOD FOR SEMICONDUCTOR ELEMENT

(71) Applicant: NATIONAL INSTITUTE OF ADVANCED INDUSTRIAL SCIENCE AND TECHNOLOGY, Tokyo (JP)

(72) Inventors: Kimihiko Kato, Ibaraki (JP); Takahiro Mori, Ibaraki (JP); Shota Iizuka, Ibaraki (JP); Takashi Nakayama, Chiba (JP); Sanghun Cho, Chiba (JP); Jyurai Kato, Chiba (JP)

(73) Assignee: NATIONAL INSTITUTE OF ADVANCED INDUSTRIAL SCIENCE AND TECHNOLOGY, Tokyo (JP)

( * ) Notice: Subject to any disclaimer, the term of this patent is extended or adjusted under 35 U.S.C. 154(b) by 456 days.

(21) Appl. No.: 18/553,693

(22) PCT Filed: Mar. 4, 2022

(86) PCT No.: PCT/JP2022/009475

§ 371 (c)(1),
(2) Date: Oct. 31, 2023

(87) PCT Pub. No.: WO2022/209589

PCT Pub. Date: Oct. 6, 2022

(65) Prior Publication Data

US 2024/0186404 A1 Jun. 6, 2024

(30) Foreign Application Priority Data

Apr. 2, 2021 (JP) ................................ 2021-063816

(51) Int. Cl.
*H01L 21/78* (2006.01)
*H10D 12/00* (2025.01)
(Continued)

(52) U.S. Cl.
CPC ......... *H10D 12/211* (2025.01); *H10D 12/021* (2025.01); *H10D 30/67* (2025.01); *H10D 62/832* (2025.01)

(58) Field of Classification Search
CPC .... H10D 12/211; H10D 12/021; H10D 30/67; H10D 62/832; H10D 30/6757;
(Continued)

(56) References Cited

U.S. PATENT DOCUMENTS 8,173,993 B2 * 5/2012 Bangsaruntip ....... H10D 62/121 257/E21.409
8,890,120 B2 * 11/2014 Kotlyar .................. H10D 62/85 257/365

(Continued)

FOREIGN PATENT DOCUMENTS

CN 105870170 A 8/2016
JP 6253034 B2 12/2012

(Continued)

OTHER PUBLICATIONS

Extended Search Report issued in European Application No. 22779814.7-1211, mailed Feb. 21, 2025.

(Continued)

*Primary Examiner* — Vu A Vu
(74) *Attorney, Agent, or Firm* — MICHAEL BEST & FRIEDRICH LLP

(57) ABSTRACT

An object of the present invention is to provide a semiconductor element capable of being manufactured in small size, easily and at a low cost and obtaining a large on-current, a semiconductor integrated circuit, and a production method for the semiconductor element.

(Continued)

A semiconductor element 10 has an element structure of a tunnel field-effect transistor. A channel part 13 formed of an indirect transition-type semiconductor is formed as a plate-like shaped portion having one end connected to a source part 14 and the other end connected to a drain part 15. Of two pairs of opposing surfaces of first opposing surfaces and second opposing surfaces which constitute the channel part 13 and are opposed in a direction perpendicular to the direction in which a current flows from the source part 14 to the drain part 15, at least one pair of the opposing surfaces selected from the two pairs is formed by arranging at a facing interval of 15 nm at the longest between the opposing surfaces, electron confinement surfaces in which a band structure of a direct transition-type semiconductor is capable of being simulatively given to the indirect transition-type semiconductor by regulation of electron motion.

7 Claims, 15 Drawing Sheets

(51) Int. Cl.
*H10D 12/01* (2025.01)
*H10D 30/67* (2025.01)
*H10D 62/832* (2025.01)

(58) Field of Classification Search
CPC .... H10D 62/121; H10D 62/17; H10D 62/405; H10D 62/83
USPC .......................................................... 257/105
See application file for complete search history.

(56) References Cited

U.S. PATENT DOCUMENTS

| | | | | |
|---|---|---|---|---|
| 9,613,955 | B1 * | 4/2017 | Anderson | H10D 30/6735 |
| 10,249,744 | B2 * | 4/2019 | Zhao | H01L 21/02293 |
| 10,600,881 | B2 * | 3/2020 | Yang | H10D 62/123 |
| 11,139,379 | B2 * | 10/2021 | Lin | H10D 84/038 |
| 12,382,843 | B2 * | 8/2025 | Mori | H10N 60/128 |
| 2017/0133493 | A1 | 5/2017 | Kotlyar et al. | |
| 2018/0158817 | A1 | 6/2018 | Zheng et al. | |

FOREIGN PATENT DOCUMENTS

| | | | |
|---|---|---|---|
| JP | 2014-120777 | A | 6/2014 |
| JP | 2020-184619 | A | 11/2020 |
| KR | 10-1631240 | B2 | 6/2016 |
| KR | 10-2019-0114695 | A | 10/2019 |
| WO | 2015/033706 | A1 | 3/2015 |
| WO | 2019/182086 | A1 | 9/2019 |

OTHER PUBLICATIONS

Kotlyar, R et al, “Bandgap engineering of group IV materials for complementary n and p tunneling field effect transistors,” Applied Physics Letters, American Institute of Physics, vol. 102, No. 11, pp. 113106-113106, XP012171573, ISSN: 0003-6951, DOI: 10.1063/1.4798283, Mar. 2023.

Ghosh et al, “Physics-Based Band Gap Model for Relaxed and Strained [100] Silicon Nanowires,” IEEE Transactions on Electron Devices, IEEE, USA, vol. 59, No. 6, pp. 1765-1772, XP011444171,ISSN: 0018-9383, DOI:10.1109/TED.2012.2190737, Jun. 2012.

International Search Report Issued in Application No. PCT/JP2022/009475, dated May 24, 2022.

Woo Young Choi et al., “Tunneling Field-Effect Transistors (TFETs) With Subthreshold Swing (SS) Less Than 60 m V/dec”, IEEE Electron Device Letters, Aug. 2007, pp. 743-745, vol. 28, Issue 8, DOI: 10.1109/LED.2007.901273, IEEE.

G. Dewey et al., “Fabrication, Characterization, and Physics of III-V Heterojunction Tunneling Field Effect Transistors (H-TFET) for Steep Sub)-Threshold Swing”, 2011 International Electron Devices Meeting Technical Digest, Date of Conference: Dec. 5-7, 2011, pp. IEDM11-785-IEDM11-788 (33.6.1-33.6.4), DOI: 10.1109IEDM.2011.6131666, IEEE.

Mathieu Luisier et al., “Simulation of nanowire tunneling transistors: From the Wentzel-Kramers-Brillouin approximation to full-band phonon-assisted tunneling”, Journal of Applied Physics, Apr. 27, 2010, pp. 084507-1-084507-6, vol. 107, Issue 8, DOI: 10.1063/1.3386521, AIP Publishing.

* cited by examiner

Bulk Si

Thin film Si
(Si 8 Layers,
1.1nm)

SEMICONDUCTOR ELEMENT, SEMICONDUCTOR INTEGRATED CIRCUIT, AND PRODUCTION METHOD FOR SEMICONDUCTOR ELEMENT

TECHNICAL FIELD

The present invention relates to a semiconductor element having an element structure of a tunnel field-effect transistor, a semiconductor integrated circuit, and a production method for the semiconductor element.

BACKGROUND ART

There have recently been many attempts to reduce the power consumption of an LSI. Reducing the operating voltage is one of such attempts, but in a MOS transistor used in a conventional circuit, it is difficult to achieve significant voltage reduction due to a physical limit. Therefore, in order to reduce the power consumption of the LSI, development of a low voltage switching device based on a different operation principle is desired intensely.

A tunnel field-effect transistor which utilizes a band-to-band tunnel phenomenon of a semiconductor is one of them, and uses the tunnel phenomenon as an operation principle different from the above-mentioned MOS transistor. The band-to-band tunnel phenomenon is a phenomenon in which even an electron that does not have sufficient energy to surmount a potential barrier passes through the other side of the barrier with a certain probability. This barrier due to potential is called a tunnel barrier.

The tunnel field-effect transistor is capable of controlling the speed at which an electron passes through the tunnel barrier, that is, the magnitude of the tunnel current by the gate voltage due to the operation principle thereof. A prototype has been reported which is capable of operating at a voltage lower than that of the MOS transistor (refer to, for example, Non-Patent Document 1).

However, in the prototype, a problem arises in that since the tunnel resistance which defines the current amount of the tunnel current is large, an on-state current (an on-current) is small.

Regarding this problem, it is also conceivable to simply increase the area of a tunnel junction portion forming the tunnel barrier, that is, the area where the band-to-band tunnel phenomenon occurs, thereby increasing the current per element even at a low current density. Such a configuration increases the size of the element, making it an impractical element unsuitable for formation of an integrated circuit. In order to obtain a highly integrated practical integrated circuit, miniaturization of the element is required.

Incidentally, semiconductor materials for manufacturing the tunnel field-effect transistor include two of a direct transition-type semiconductor and an indirect transition-type semiconductor. The former mainly corresponds to a compound semiconductor, and the latter mainly corresponds to a Group IV semiconductor.

Since the probability of the occurrence of the band-to-band tunnel phenomenon is generally higher in the direct transition-type semiconductor than in the indirect transition-type semiconductor, the use of the compound semiconductor is considered effective for an increase in the on-current (refer to Non-Patent Document 2).

However, in the method using the compound semiconductor, most of the existing semiconductor element manufacturing equipment cannot be used for manufacture of the tunnel field-effect transistor. Therefore, a problem arises in that new equipment investment is required and the manufacturing cost increases.

On the other hand, the representative materials of the group IV semiconductor include silicon and germanium. Although the tunnel field-effect transistor can be manufactured using the existing semiconductor element manufacturing equipment, the probability of the occurrence of the band-to-band tunnel phenomenon is low, and there still remains the problem of increasing the on-current.

For this problem, the present inventors have reported the tunnel field-effect transistor in which the on-current is increased by introducing an isoelectronic trap-forming impurity into the indirect transition-type semiconductor (refer to Patent Document 1).

The technique of introducing the isoelectronic trap-forming impurity is also one of the techniques for solving the problem.

Also, as another method, it has been reported that the on-current is increased by introducing a structure of a silicon nanowire obtained by processing silicon into a wire shape having a diameter of about 3 nm (refer to Non-Patent Document 3). In this report, it has also been reported that silicon, which is originally the indirect transition-type semiconductor, is converted into a direct transition type simulatively by adopting the silicon nanowire structure.

However, a problem arises in that the silicon nanowire having the diameter of 3 nm is difficult to process, leading to an increase in the manufacturing cost. In particular, since the cross section of the silicon nanowire is made perfectly circular, and the gate electrode is arranged to uniformly cover the entire periphery of the silicon nanowire, the increasing difficulty of the processing process and the increase in manufacturing cost are remarkable.

PRIOR ART DOCUMENTS

Patent Document

Patent Document 1: Japanese Patent No. 6253034

Non-Patent Documents

Non-Patent Document 1: W. Y. Choi et al., IEEE Electron Device Letters vol. 28, p 743(2007), "Tunneling Field-Effect Transistors (TFETs) with Subthreshold Swing (SS) Less Than 60 mV/dec"

Non-Patent Document 2: G. Dewey et al., 2011 International Electron Devices Meeting Technical Digest, 33.6, "Fabrication, characterization, and physics of III-V heterojunction tunneling Field Effect Transistors (H-TFET) for steep sub-threshold swing"

Non-Patent Document 3: Mathieu Luisier et al., Journal of Applied Physics vol. 107, p. 084507 (2010), "Simulation of nanowire tunneling transistors: From the Wentzel-Kramers-Brillouin approximation to full-band phonon-assisted tunneling"

DISCLOSURE OF THE INVENTION

Problems to be Solved by the Invention

An object of the present invention is to solve the above-mentioned various problems in the related art and to achieve the following object. That is, an object of the present invention is to provide a semiconductor element capable of being manufactured in small size, easily and at a low cost and obtaining a large on-current, a semiconductor integrated circuit, and a production method for the semiconductor element.

Means for Solving the Problems

Means for solving the above problems are as follows:

<1> In a semiconductor element having an element structure of a tunnel field-effect transistor, a channel part formed of an indirect transition-type semiconductor is configured to have a plate-like shaped portion having one end connected to a source part and the other end connected to a drain part. Further, of two pairs of opposing surfaces of first opposing surfaces and second opposing surfaces which constitute the plate-like shaped portion and are opposed in a direction perpendicular to the direction in which a current flows from the source part to the drain part, at least one pair of the opposing surfaces selected from the two pairs is formed by arranging at a facing interval of 15 nm at the longest between the opposing surfaces, electron confinement surfaces in which a band structure of a direct transition-type semiconductor is capable of being simulatively given to the indirect transition-type semiconductor by regulation of electron motion.

<2> The semiconductor element described in the above <1>, in which all of the four constituent surfaces constituting the first opposing surfaces and the second opposing surfaces are constituted of the electron confinement surfaces.

<3> The semiconductor element described in the above <1> or <2>, in which a gate part constituting the element structure of the tunnel field-effect transistor is arranged to cover all or part of at most three of the four constituent surfaces constituting the first opposing surfaces and the second opposing surfaces.

<4> The semiconductor element described in any of the above <1> to <3>, in which the indirect transition-type semiconductor is silicon, and the electron confinement surface is a {100} plane.

<5> The semiconductor element described in any of the above <1> to <3>, in which the indirect transition-type semiconductor is germanium, and the electron confinement surface is a {111} plane.

<6> The semiconductor element described in any of the above <1> to <3>, in which the indirect transition-type semiconductor is a mixed crystal of silicon and germanium, the electron confinement surface is a {100} plane when the content of the germanium is less than 85 atomic %, and the electron confinement surface is a {111} plane when the content of the germanium is 85 atomic % or more.

<7> The semiconductor element described in any of the above <1> to <6>, in which a tunnel junction formed in the tunnel field-effect transistor is constituted of a semiconductor junction.

<8> The semiconductor element described in any of the above <1> to <6>, in which the tunnel junction formed in the tunnel field-effect transistor is constituted of a Schottky junction.

<9> A semiconductor integrated circuit having the semiconductor element described in any of the above <1> to <8>.

<10> A method for manufacturing the semiconductor element described in any of the above <1> to <8>, which includes a channel part forming step of forming by an indirect transition-type semiconductor, a channel part having a plate-like shaped portion having one end connected to a source part and the other end connected to a drain part, and forming, of two pairs of opposing surfaces of first opposing surfaces and second opposing surfaces which constitute the plate-like shaped portion and are opposed in a direction perpendicular to the direction in which a current flows from the source part to the drain part, at least one pair of the opposing surfaces selected from the two pairs by arranging at a facing interval of 15 nm at the longest between the opposing surfaces, electron confinement surfaces in which a band structure of a direct transition-type semiconductor is capable of being simulatively given to the indirect transition-type semiconductor by regulation of electron motion.

Advantageous Effect of the Invention

According to the present invention, it is possible to solve the above various problems in the related art and to provide a semiconductor element capable of being manufactured in small size, easily and at a low cost and obtaining a large on-current, a semiconductor integrated circuit, and a production method for the semiconductor element.

BRIEF DESCRIPTION OF THE DRAWINGS

FIG. 1(*b*) is a view showing an energy band of an indirect transition-type semiconductor brought into a direct transition-type semiconductor simulatively.

FIG. 5(*b*) is a cross-sectional view taken along line A-A in a direction (Y direction in FIG. 4) parallel to the direction of the current flow in FIG. 5(*a*).

FIG. 6(*b*) is a view showing constant-energy surfaces near the lower end of a conduction band of germanium in a bulk state.

FIG. 8(*b*) is a cross-sectional view taken along line A-A in a direction (Y direction in FIG. 7) parallel to the direction of the current flow in FIG. 8(*a*).

FIG. 9(*b*) is the figure (1) showing the manufacturing process of the semiconductor element 10 according to the first embodiment, and is a cross-sectional view taken along line A-A of FIG. 9(*a*).

FIG. 10(*b*) is the figure (2) showing the manufacturing process of the semiconductor element 10 according to the first embodiment, and is a cross-sectional view taken along line A-A of FIG. 10(*a*).

FIG. 11(*b*) is the figure (3) showing the manufacturing process of the semiconductor element 10 according to the first embodiment, and is a cross-sectional view taken along line A-A of FIG. 11(*a*).

FIG. 12(*b*) is the figure (4) showing the manufacturing process of the semiconductor element 10 according to the first embodiment, and is a cross-sectional view taken along line A-A of FIG. 12(*a*).

FIG. 13(*b*) is the figure (5) showing the manufacturing process of the semiconductor element 10 according to the first embodiment, and is a cross-sectional view taken along line A-A of FIG. 13(*a*).

FIG. 14(*b*) is the figure (6) showing the manufacturing process of the semiconductor element 10 according to the first embodiment, and is a cross-sectional view taken along line A-A of FIG. 14(*a*).

FIG. 15(*b*) is the figure (7) showing the manufacturing process of the semiconductor element 10 according to the first embodiment, and is a cross-sectional view taken along line A-A of FIG. 15(*a*).

FIG. 16(*b*) is a view showing an overview of a method of forming a channel part using a GOI substrate having a (110) plane as a principal surface.

FIG. 17(*b*) is the figure (1) showing the manufacturing process of the semiconductor element of the present invention related to the semiconductor element 20 according to the second embodiment, and is a cross-section taken along line A-A of FIG. 17(*a*).

FIG. 18(*b*) is the figure (2) showing the manufacturing process of the semiconductor element of the present invention related to the semiconductor element 20 according to the second embodiment, and is a cross-section taken along line A-A of FIG. 18(*a*).

FIG. 19(*b*) is the figure (3) showing the manufacturing process of the semiconductor element of the present invention related to the semiconductor element 20 according to the second embodiment, and is a cross-section taken along line A-A of FIG. 19(*a*).

FIG. 20(*b*) is a view showing an energy band structure of plate-like silicon with a thickness of about 1.1 nm.

MODE FOR CARRYING OUT THE INVENTION (Semiconductor Element and Production Method Therefor)

A semiconductor element of the present invention is characterized by including an element structure of a tunnel field-effect transistor, and a channel part formed of an indirect transition-type semiconductor which is configured to have a plate-like shaped portion having one end connected to a source part and the other end connected to a drain part, wherein, of two pairs of opposing surfaces of first opposing surfaces and second opposing surfaces which constitute the plate-like shaped portion and are opposed in a direction perpendicular to the direction in which a current flows from the source part to the drain part, at least one pair of the opposing surfaces selected from the two pairs is formed by arranging electron confinement surfaces at a facing interval of 15 nm at the longest between the opposing surfaces.

Further, a semiconductor element manufacturing method of the present invention is a method of manufacturing the semiconductor element of the present invention. The method is characterized by including a channel part forming step of forming by an indirect transition-type semiconductor, a channel part being configured to have a plate-like shaped portion having one end connected to a source part and the other end connected to a drain part, and forming, of two pairs of opposing surfaces of first opposing surfaces and second opposing surfaces which constitute the plate-like shaped portion and are opposed in a direction perpendicular to the direction in which a current flows from the source part to the drain part, at least one pair of the opposing surfaces selected from the two pairs by arranging electron confinement surfaces at a facing interval of 15 nm at the longest between the opposing surfaces.

With these characteristics, the behavior of electrons confined in the electron confinement surface is controlled in the plate-like shaped portion formed of the indirect transition-type semiconductor in the same manner as in the direct transition-type semiconductor to increase a tunnel current of the semiconductor element. Further, the semiconductor element can be manufactured in small size, easily and at a low cost by forming the channel part through which the tunnel current flows, so as to have the plate-like shaped portion that can be manufactured in small size, easily and at a low cost, while utilizing the existing manufacturing equipment.

A mechanism for increasing the tunnel current will be described in detail.

A distinctive feature of the indirect transition-type semiconductor is that a momentum at an uppermost end of a valence band (valence band maximum) does not match a momentum at a lowermost end of a conduction band (conduction band minimum).

Figure 1A:
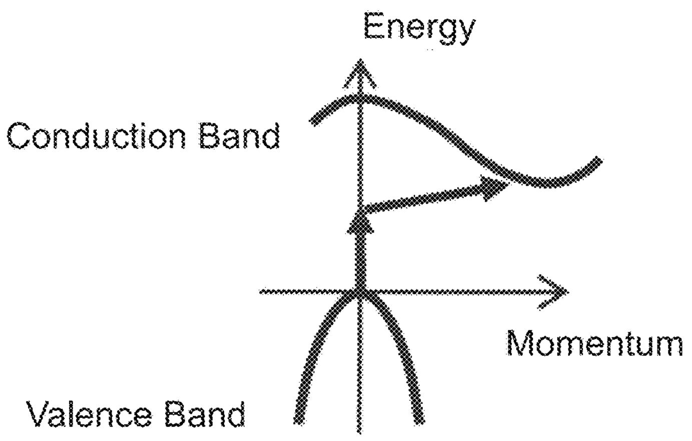
FIG. 1(*a*) is a view showing an energy band of an indirect transition-type semiconductor in a bulk state.
Figure 1B:
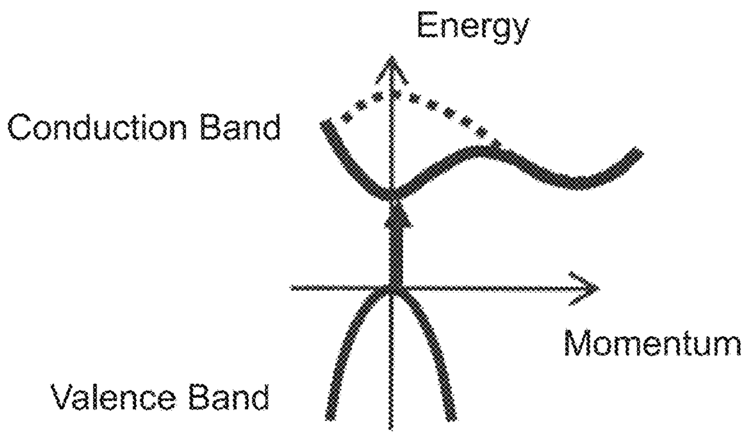

That is, as shown in FIG. 1(*a*), the momentum of electrons at the uppermost end of the valence band is zero, whereas the momentum of electrons at the lowermost end of the conduction band is not zero. In other words, there is a momentum gap between the electrons at the uppermost end of the valence band and the electrons at the lowermost end of the conduction band. Incidentally, FIG. 1(*a*) is a view showing the energy bands of the indirect transition-type semiconductor in a bulk state.

The state transition of electrons from the valence band to the conduction band accompanying band-to-band tunneling must satisfy the law of conservation of momentum. In the tunnel field-effect transistor using the indirect transition-type semiconductor with the momentum gap, it is difficult to obtain a large tunnel current due to the constraint of the law of conservation of momentum.

However, the indirect transition-type semiconductor is brought into a direct transition-type semiconductor simulatively, so that the tunnel current can be increased even in the tunnel field-effect transistor using the indirect transition-type semiconductor, and a configuration required for this purpose is defined as a configuration in which the plate-like shaped portion is provided to the channel part.

In the plate-like shaped portion, when two conditions: (1) of two pairs of opposing surfaces of first opposing surfaces and second opposing surfaces facing each other in a direction perpendicular to the direction in which the current flows from the source part to the drain part, at least one pair of the opposing surfaces is constituted of electron confinement surfaces, and (2) the electron confinement surfaces are arranged at an extremely short facing interval being a distance of 15 nm at the longest, are satisfied, the indirect transition-type semiconductor is brought into a direct transition-type semiconductor simulatively although it is of the indirect transition-type semiconductor.

That is, as shown in FIG. 1(*b*), the plate-like shaped portion that satisfies the above two conditions loses the above-described features as the distinctive features of the indirect transition-type semiconductor, and the momentum of electrons at the valence-band uppermost end and the conduction-band lowermost end both become zero. Incidentally, FIG. 1(*b*) is a view showing the energy band of the indirect transition-type semiconductor brought into a direct transition-type semiconductor simulatively.

This state will be described with reference to FIG. 2.

Figure 2:
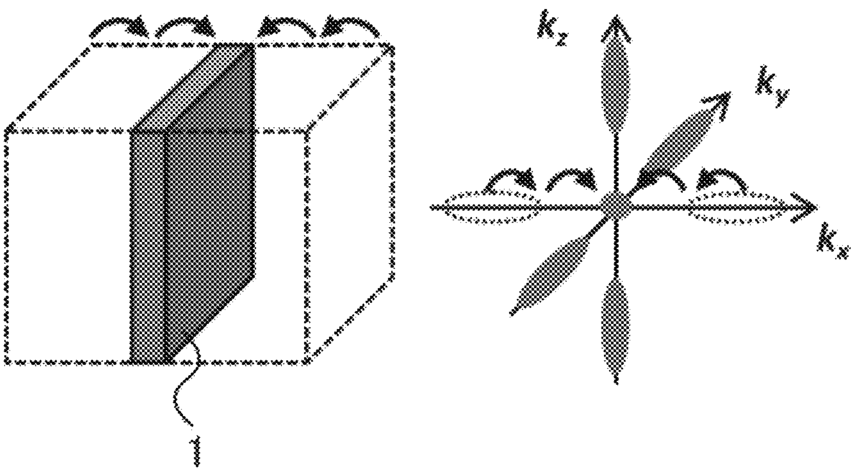
FIG. 2 is an explanatory view for describing the manner in which the indirect transition-type semiconductor is brought into a direct transition-type semiconductor simulatively.

As shown in the example of FIG. 2, when the facing interval between the electron confinement surfaces facing each other is shortened, that is, when the thickness of a plate-like indirect transition-type semiconductor 1 in a $k_x$ direction is decreased, the electrons are confined in a narrow region. When this thickness becomes 15 nm or less, the momentum of an electron in the $k_x$ direction is lost. Therefore, there occurs a state in which the momenta of electrons at the uppermost end of the valence band and the lowermost end of the conduction band both become zero (a transition state of the direct transition-type semiconductor). At this time, if the indirect transition-type semiconductor 1 is arranged in a direction in which the direction in which the current flows from the source part to the drain part is parallel to a $k_y$ direction (or $k_z$ direction), and the opposing surfaces facing each other in the $k_x$ direction orthogonal to the $k_y$ direction (or $k_z$ direction) are constituted of the electron confinement surfaces, the restriction due to the law of conservation of momentum is relaxed, and the tunneling probability of electrons directly transitioning from the valence band to the conduction band is increased, so that a large tunnel current is obtained. Hereinafter, the effect of obtaining a large tunnel current based on this control of electron motion is referred to as a "convolution effect", following the manner in which electrons are convoluted into local positions according to the thickness.

Incidentally, FIG. 2 is an explanatory view for explaining the manner in which the indirect transition semiconductor is brought into a direct transition-type semiconductor simulatively.

As a physical phenomenon suggesting the simulative direct transition-type semiconductor brought about by thin layering of the indirect transition-type semiconductor, there is a light emission phenomenon from the indirect transition-type semiconductor. Intrinsically, it is not possible to obtain large light emission from the indirect transition-type semiconductor, but it is known that the light emission intensity increases exponentially by making the layer thinner (refer to Reference 1 described below).

This is because the indirect transition-type semiconductor is brought into a direct transition-type semiconductor simulatively and electron-hole pairs are easily recombined at the point where the momentum is zero.

Reference 1: Japanese Patent Laid-Open No. 2007-294628

Although the light emission phenomenon and the band-to-band tunnel phenomenon are different phenomena, in the present invention, the simulative direct transition-type semiconductor brought about by thin layering of the indirect transition-type semiconductor is applied to a tunnel field-effect transistor utilizing the band-to-band tunnel phenomenon. By satisfying the two conditions described above for the plate-like shaped portion, the effect of increasing the tunnel current in the tunnel field-effect transistor can be obtained.

Figure 3:
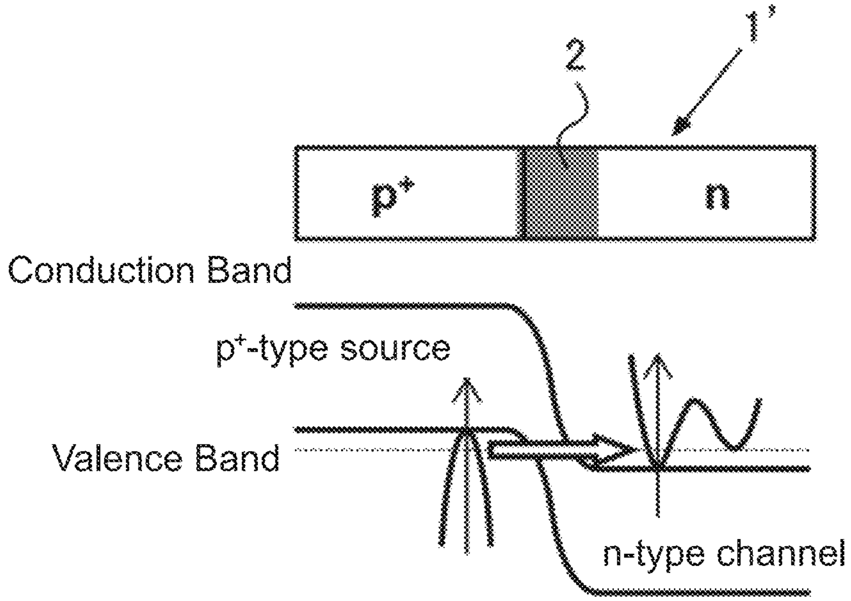
FIG. 3 is a view schematically showing the manner in which a tunnel current increases with an N-type tunnel field-effect transistor taken as an example.

FIG. 3 is a view schematically showing the manner in which a tunnel current increases with an N-type tunnel field-effect transistor taken as an example.

As shown in the example of FIG. 3, when the tunnel current passes through the tunnel barrier of a tunnel junction 2 formed between a $p^+$ source region and an n-type channel region in a plate-shaped indirect transition-type semiconductor 1', there occurs in the plate-shaped indirect transition-type semiconductor 1', a state in which due to the convolution effect, the momenta of electrons at the uppermost end of the valence band and the lowermost end of the conduction band are both zero, and the restriction by the law of conservation of momentum is relaxed and hence the tunnel probability increases.

Next, each configuration in the semiconductor element of the present invention will be described in detail.

<Element Structure of Tunnel Field-Effect Transistor>

The element structure of the tunnel field-effect transistor includes the source part, the channel part adjacent to the source part and having a boundary thereof as the tunnel junction where the tunnel barrier is formed, the drain part arranged adjacent to the channel part, and the gate part arranged so as to cover the whole or part of the exposed portion of the channel part.

The semiconductor element of the present invention has the above-described features in the more specific structure of the channel part in the element structure.

<Source Part and Drain Part>

The source part and the drain part are formed in the same manner as known source and drain regions formed by introducing impurities into a semiconductor, or known source and drain electrodes formed of a metal material.

When the source part and the drain part are formed as the source region and the drain region, the source region is formed of a first conductivity type which is either a P-type or an N-type conductivity type, and the drain region is formed of a second conductivity type which is the conductivity type different from the first conductivity type. Further, the source region forms a semiconductor junction constituted by a junction between semiconductors with the channel part formed of the indirect transition-type semiconductor, and the tunnel junction is constituted by the semiconductor junction.

A method for forming the tunnel junction in the semiconductor junction is not particularly limited, and a known method such as providing a steep concentration profile of an impurity substance between the source region and the channel part can be mentioned.

The semiconductor forming the source region and the drain region is not particularly limited as long as it is a material capable of forming a tunnel junction with the channel part, and known semiconductor materials can be applied. It is however preferable that in terms of production, they are formed of the same semiconductor material as the indirect transition-type semiconductor which constitutes the channel part. That is, in this case, a typical manufacturing method can be applied in which the impurity is doped into one semiconductor substrate by ion implantation or the like to form the source region and the drain region.

Further, the impurity is not particularly limited, and known impurities such as boron, phosphorus, arsenic, etc. can be used.

Incidentally, when the semiconductor element is operated as a P-type tunnel field-effect transistor, the source region is configured as an N-type ($N^+$) semiconductor region, and the drain region is configured as a P-type ($P^+$) semiconductor region. Conversely, when the semiconductor element is operated as an N-type tunnel field-effect transistor, the source region is configured as a P-type ($P^+$) semiconductor region, and the drain region is configured as an N-type ($N^+$) semiconductor region.

When the source part and the drain part are formed as the source electrode and the drain electrode respectively, the source electrode and the channel part are joined with a Schottky junction to form a tunnel junction.

The source electrode and the drain electrode as described above are not particularly limited, and can include known metal materials. For example, when the channel part is made of silicon, metal silicide such as $NiSi_2$ may be mentioned. When the channel part is made of germanium, metal germanide such as NiGe may be mentioned. When the channel part is made of a mixed crystal of silicon and germanium, alloys containing Ni, Si, and Ge such as an alloy of NiSi and NiGe, etc. may be mentioned.

Further, a method for forming the source electrode and the drain electrode is not particularly limited either, and known forming methods such as a sputtering method and a CVD method using the metal material may be mentioned.

<Channel Part>

As described above, the channel part is formed of the indirect transition-type semiconductor and is configured to have the plate-like shaped portion having one end connected to the source part and the other end connected to the drain part.

In the plate-like shaped portion, based on the two conditions described above, at least one pair of the opposing surfaces of the two pairs of the opposing surfaces of the first opposing surfaces and the second opposing surfaces facing each other in the direction orthogonal to the direction in which the current flows from the source part to the drain part is formed by arranging the electron confinement surfaces at a facing interval of 15 nm at the longest.

The plate-like shaped portion may be a shaped portion existing in the channel part. The plate-like shaped portion may be configured by the entire channel part or the plate-like shaped portion may be configured by a portion of the channel part. Since the band-to-band tunnel phenomenon occurs when the electrons pass through the tunnel junction formed between the source region and the channel part, the entire channel part including the portion not involved in the tunnel junction is not required to be subjected to thin layering.

Further, as the plate-like shaped portion, the channel part may be configured by one plate-like shaped portion, or the channel part may be configured by a plurality of the plate-like shaped portions.

When all the four constituent surfaces constituting the first opposing surfaces and the second opposing surfaces are constituted of the electron confinement surfaces, the restriction by the law of conservation of momentum is further relaxed, and hence the tunnel probability can be further increased.

In addition, when both the first opposing surfaces and the second opposing surfaces formed by the electron confinement surfaces are configured to be formed by arranging the electron confinement surfaces at a facing interval of 15 nm at the longest, the restriction by the law of conservation of momentum is further relaxed, and hence the tunnel probability can be further increased.

The electron confinement surface is a plane that allows the band structure of the direct transition-type semiconductor to be simulatively given to the indirect transition-type semiconductor by regulation of electron motion, and differs depending on the type of the indirect transition-type semiconductor. The electron confinement surface can be described by the crystal plane for each type of the indirect transition-type semiconductor.

Specifically, from the band structure peculiar to the bulk material illustrated in FIG. 1(*a*), it is determined for each type of the indirect transition-type semiconductor. For example, in the case of silicon, the {100} plane corresponds to the electron confinement surface. In the case of germanium, the {111} plane corresponds to the electron confinement surface. Further, in the case of the mixed crystal of silicon and germanium, the {100} plane corresponds to the electron confinement surface if the content of the germanium is less than 85 atomic %, and the {111} plane corresponds to the electron confinement surface if the content of the germanium is 85 atomic % or more.

The facing interval between the facing surfaces (electron confinement surfaces) for obtaining the convolution effect is not particularly limited as long as it is 15 nm or less. From the viewpoint of obtaining a larger tunnel current as well as miniaturization, the facing interval is preferably 10 nm or less, more preferably 8 nm or less, more preferably 6 nm or less, and particularly preferably 4 nm or less. Incidentally, the lower limit is about 1 nm from the viewpoint of reducing the amount of current due to the surface roughness of the channel part.

The method of forming the channel part is not particularly limited, and can be appropriately selected from among the forming methods in the existing semiconductor equipment. The method includes, for example, an electron beam lithography processing method, an epitaxial growth method performed by controlling the growth time, and the like.

Further, the channel part may be formed of the indirect transition-type semiconductor. It is possible to suitably use a material of an intrinsic semiconductor or a material doped with the impurity at a low concentration in the single crystal structure of its forming material.

<Gate Part>

The gate part is a portion configured such that a gate electrode covers all or part of the exposed portion of the channel part with a gate insulating film interposed therebetween.

The material for forming the gate insulating film is not particularly limited and can be appropriately selected depending on the purpose. The material includes, for example, $HfO_2$, $Al_2O_3$, $ZrO_2$ and the like.

Further, a method for forming the gate insulating film is not particularly limited and can be appropriately selected depending on the purpose. For example, an ALD method, a sputtering method, a CVD method, or the like using the above-described forming material may be mentioned.

The material for forming the gate electrode is not particularly limited and can be appropriately selected depending on the purpose. The forming material includes, for example, TiN, TaN, NiSi and the like.

Further, a method for forming the gate electrode is not particularly limited and can be appropriately selected depending on the purpose. Examples thereof include an ALD method, a sputtering method, a CVD method, or the like using the forming material.

A specific configuration of the gate part is not particularly limited and can be appropriately selected depending on the purpose. For example, although it is also possible to configure it with an all-around structure that covers all of the four constituent surfaces constituting the first opposing surfaces and the second opposing surfaces in the plate-like shaped portion of the channel part, it is not necessary to cover all of the constituent surfaces. From the viewpoint of manufacturing in small size, easily and at a low cost, it is preferable to arrange the gate part so as to cover all or part of at most three of the four constituent surfaces constituting the first opposing surfaces and the second opposing surfaces.

First Embodiment

A semiconductor element according to a first embodiment of the present invention will hereinafter be described with reference to the drawings.

Figure 4:
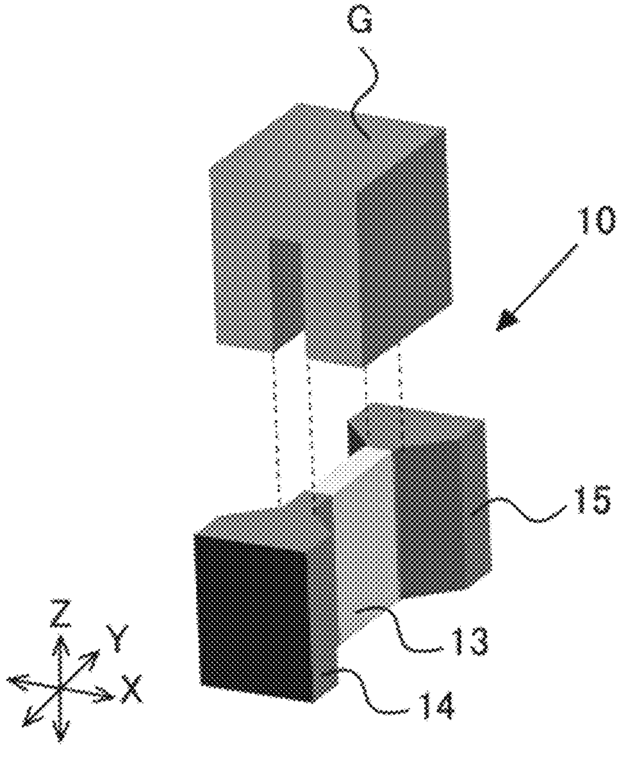
FIG. 4 is an exploded perspective view of a semiconductor element according to a first embodiment.

FIG. 4 is an exploded perspective view of the semiconductor element according to the first embodiment. Further, FIG. 5(*a*) is a cross-sectional view in a direction (X direction in FIG. 4) perpendicular to the direction in which a current flows, and FIG. 5(*b*) is a cross-sectional view taken along line A-A in FIG. 5(*a*) in a direction (Y direction in FIG. 4) parallel to the direction in which the current flows.

As shown in FIG. 4, the semiconductor element 10 is comprised of a source part 14, a channel part 13 which is arranged adjacent to the source part 14 and whose boundary is defined as the tunnel junction where the tunnel barrier is formed, a drain part 15 arranged adjacent to the channel part 13, and a gate part G arranged so as to cover all or part of the exposed portion of the channel part 13, and has the element structure of the tunnel field-effect transistor.

Figure 5A:
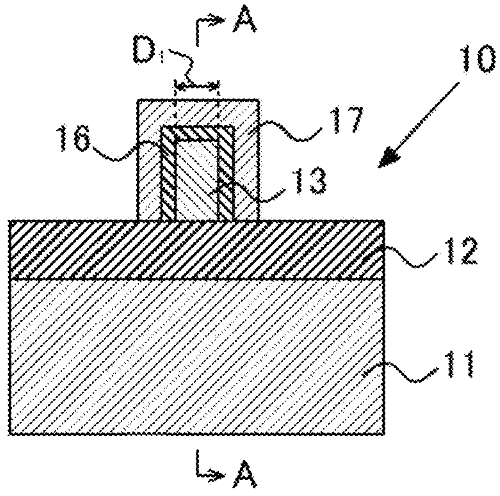
FIG. 5(*a*) is a cross-sectional view in a direction (X direction in FIG. 4) perpendicular to the direction in which a current flows.
Figure 5B:
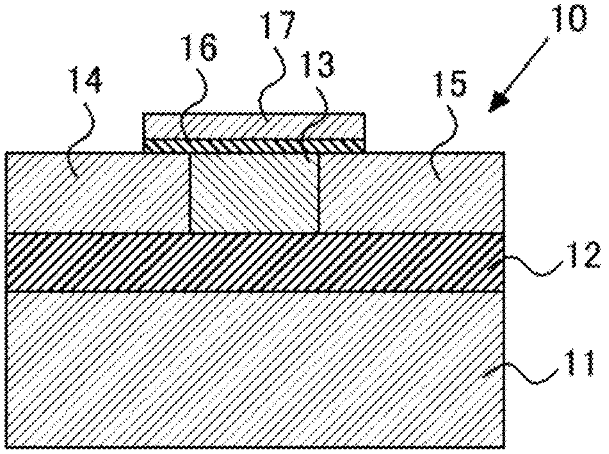

As shown in FIGS. 5(*a*) and 5(*b*), for example, the semiconductor element 10 can be formed on an arbitrary substrate such as an SOI (Silicon-on-insulator) substrate having a surface insulating layer 12 formed on a semiconductor layer 11. However, the semiconductor layer 11 and the surface insulating layer 12 are optional structures which are not involved in the operation of the semiconductor element 10.

The channel part 13 is formed of an intrinsic semiconductor or silicon doped with the impurity at a low concentration (for example, about $1\times10^{13}$ $cm^{-3}$ to $1\times10^{16}$ $cm^{-3}$), and is constituted of the plate-like shaped portion itself whose one end is connected to the source part 14, and whose other end is connected to the drain part 15.

Of two pairs of the first opposing surfaces and the second opposing surfaces that constitute the plate-like shaped portion of the channel part 13 and are opposed in a direction perpendicular to the direction in which a current from the source part 14 to the drain part 15 flows, a pair of the opposing surfaces (opposing surfaces facing each other in the X direction in FIG. 4) is each formed of {100} planes of silicon and constitutes the electron confinement surfaces. The thickness $D_1$ (refer to FIG. 5(*a*)) of the channel part 13 in the X direction in FIG. 4, which determines a facing interval between the electron confinement surfaces, is set to 15 nm at the longest, and the channel part 13 is configured to obtain the convolution effect.

The source part 14 and the drain part 15 are formed as the source region and the drain region formed by doping silicon with the impurity at a high concentration (for example, about $1\times10^{19}$ $cm^{-3}$ to $1\times10^{21}$ $cm^{-3}$), and the tunnel junction is constituted of the semiconductor junction between the channel part 13 and the source part 14.

The gate part G is configured so that a gate electrode 17 covers all or part of the exposed portion of the channel part 13 with a gate insulating film 16 interposed therebetween. Specifically, the gate part G is arranged so as to cover three of the four constituent surfaces constituting the first opposing surfaces and the second opposing surfaces. Incidentally, the element structure of the transistor in which the three surfaces of the plate-shaped channel part 13 are covered with the gate part G in this way is known as a Fin-FET, and can be suitably manufactured using the existing semiconductor equipment.

In the present example, the thickness $D_1$ of the channel part 13 is made uniform. However, since the band-to-band tunnel phenomenon occurs in a form in which electrons pass through the tunnel junction configured by the semiconductor junction between the channel part 13 and the source part 14, the facing interval (thickness $D_1$ of the channel part 13) between the electron confinement surfaces at a portion (portion that extends about 15 nm from one end to the other end side at the shortest) near the tunnel junction extending to one end in contact with the source part 14 in the channel part 13 and the other end side in the direction (Y direction in FIG. 4) toward the drain part 15 from the one end is set to a short interval of 15 nm at the longest. In the channel part 13 on the drain part 15 side from the portion near the tunnel junction, the facing interval between the electron confinement surfaces (thickness $D_1$ of the channel part 13) may be configured to exceed 15 nm.

In the present example as well, the portion of the source part 14 forming the tunnel junction with the channel part 13 has the same shape as the plate-like shaped portion of the channel part 13. That is, the source part 14 is formed so as to be tapered toward the channel part 13 side and the end thereof joined to the channel part 13 is taken as one end, and the portion on the one end side is formed as a plate-like shaped portion. Of the two pairs of opposing surfaces of the first opposing surfaces and the second opposing surfaces constituting the plate-like shaped portion, which face each other in a direction perpendicular to the direction in which the current from the source part 14 to the drain part 15 flows, one pair of the opposing surfaces (opposing surfaces facing each other in the X direction in FIG. 4) is each formed of the {100} plane of silicon as with the plate-like shaped portion in the channel part 13, and constitutes the electron confinement surfaces. The thickness of the plate-like shaped portion in the source part 14 in the X direction in FIG. 4, which determines the facing interval between these electron confinement surfaces, is set to 15 nm at the longest, and a portion (portion extending about 10 nm at the shortest from the one end toward the other end in the direction away from the drain part 15, which is the direction opposite to the direction in which the current flows) near the tunnel junction which is formed as the plate-like shaped portion in the source part 14 is configured so that the convolution effect is obtained.

Thus, when the channel part 13 and the source part 14 forming the tunnel junction are respectively configured so as to obtain the convolution effect, the tunnel probability in the tunnel junction increases, and a larger tunnel current can be obtained.

In the present example, the channel part 13 is formed of silicon. However, when the channel part 13 is formed of germanium, the opposing surfaces (opposing surfaces facing each other in the X direction in FIG. 4) are each formed by the {111} plane in germanium to constitute the electron confinement surfaces. Further, when the content of germanium is less than 85 atomic % where the channel part 13 is formed of a mixed crystal of silicon and germanium, the opposing surfaces (opposing surfaces facing each other in the X direction in FIG. 4) are each formed by the {100} plane in the mixed crystal of silicon and germanium to constitute the electron confinement surfaces. When the content of germanium is 85 atomic % or more, the opposing surfaces (opposing surfaces facing each other in the X direction in FIG. 4) are each formed by the {111} plane in the mixed crystal of silicon and germanium to constitute the electron confinement surfaces.

The reason for this is as follows.

Figure 6A:
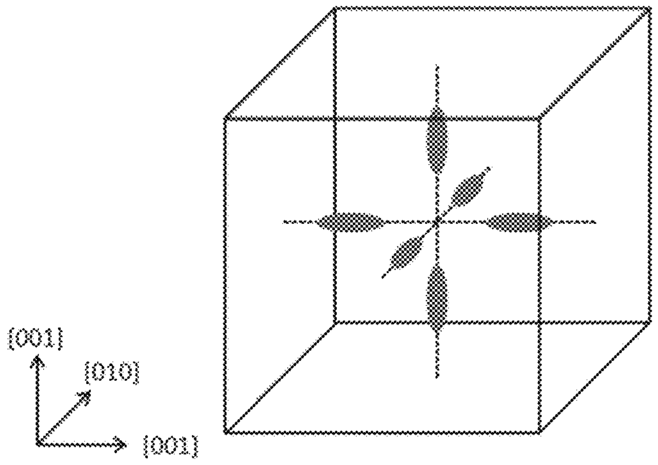
FIG. 6(*a*) is a view showing constant-energy surfaces near the lower end of a conduction band of silicon in a bulk state.
Figure 6B:
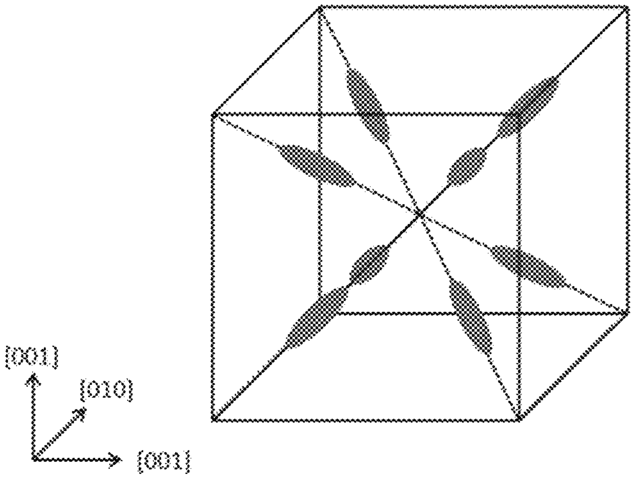

First, a constant-energy surface near the lower end of the conduction band of silicon in a bulk state is shown in FIG. 6(*a*). In the case of silicon, the position of the conduction band lower end is not on the zero-momentum point, but exists on the <100> direction axis with 6-fold symmetry. Therefore, it is most effective to obtain the convolution effect by thin layering in the direction perpendicular to the <100> direction. That is, it is most effective to form the electron confinement surfaces by forming the opposing surfaces (opposing surfaces facing each other in the X direction in FIG. 4) with the {100} plane of silicon.

Next, a constant-energy surface near the lower end of the conduction band of germanium in the bulk state is shown in FIG. 6(*b*). In the case of germanium, the position of the lower end of the conduction band is not on the zero-momentum point, but exists on the <111> direction axis with 8-fold symmetry. Therefore, it is most effective to obtain the convolution effect by thin layering in the direction perpendicular to the <111> direction. That is, it is most effective to constitute the electron confinement surfaces by forming the opposing surfaces (opposing surfaces facing each other in the X direction in FIG. 4) with the {111} plane of germanium.

Next, in the case of a mixed crystal of silicon and germanium having a germanium content of less than 85%, the component contributing to silicon is strong in a state in which no external stress is applied. Therefore, the position of the lower end of the conduction band exists on the 6-fold symmetrical <100> direction axis as with silicon. Thus, it is most effective to constitute the electron confinement surfaces by forming the opposing surfaces (opposing surfaces facing each other in the X direction in FIG. 4) with the {100} plane in the mixed crystal of silicon and germanium as with silicon.

Next, in the case of a mixed crystal of silicon and germanium with a germanium content of 85% or more, since the component contributing to germanium is strong in the state in which no external stress is applied, the position of the lower end of the conduction band exists on the 8-fold symmetrical <111> direction axis as with germanium. Therefore, as with germanium, it is most effective to constitute the electron confinement surfaces by forming the opposing surfaces (opposing surfaces facing each other in the X direction in FIG. 4) with the {111} plane in the mixed crystal of silicon and germanium.

Thus, the electron confinement surfaces can be defined by determining the crystal orientation that regulates electron movement from the energy state specific to the indirect transition-type semiconductor material in the bulk state.

As described above, in the semiconductor element 10, at and near the tunnel junction in which the band-to-band tunnel phenomenon occurs, the tunneling probability of electrons passing through the tunnel junction is improved by the convolution effect equivalently to the direct transition-type semiconductor, so that a tunnel current can be increased. Further, it is possible to manufacture the semiconductor element in a small size, easily and at low cost by utilizing the existing manufacturing equipment for the indirect transition-type semiconductor.

As a modification of the first embodiment, when the source electrode and the drain electrode are arranged and the source electrode and the channel part are joined by the Schottky junction to form the tunnel junction, the source part 14 and the drain part 15 in the semiconductor element 10 may be composed of the source electrode and the drain electrode respectively, and the source electrode and the channel part 13 may be joined by the Schottky junction to form the tunnel junction.

Second Embodiment

A semiconductor element according to a second embodiment of the present invention will be described below with reference to the drawings.

Figure 7:
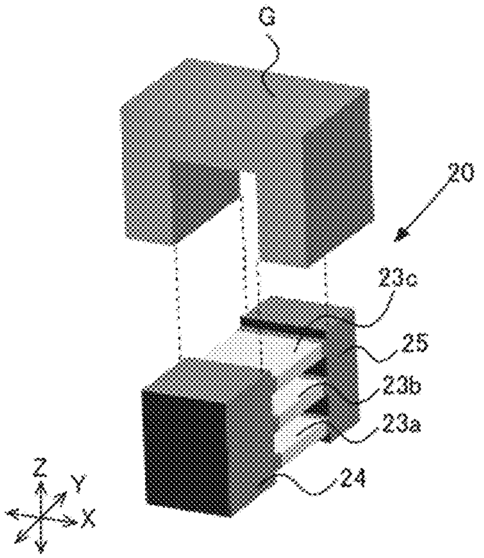
FIG. 7 is an exploded perspective view of a semiconductor element according to a second embodiment.

FIG. 7 is an exploded perspective view of the semiconductor element according to the second embodiment. Further, FIG. 8(*a*) is a cross-sectional view in a direction (X direction in FIG. 7) orthogonal to the direction in which a current flows, and FIG. 8(*b*) is a cross-sectional view taken along line A-A in FIG. 8(*a*) in a direction (Y direction in FIG. 7) parallel with the direction of the current flow in FIG. 8(*a*).

As shown in FIG. 7, the semiconductor element 20 is comprised of a source part 24, channel parts 23*a* to 23*c* arranged adjacent to the source part 24 and whose boundaries are taken as the tunnel junctions where the tunnel barriers are formed, a drain part 25 arranged adjacent to the channel parts 23$a$ to 23$c$, and a gate part G arranged so as to cover all or part of the exposed portions of the channel parts 23$a$ to 23$c$. The semiconductor element 20 has the element structure of the tunnel field-effect transistor.

Figure 8A:
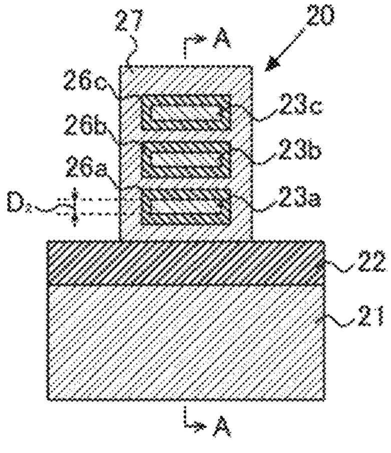
FIG. 8(*a*) is a cross-sectional view in a direction (X direction in FIG. 7) orthogonal to the direction in which a current flows.
Figure 8B:
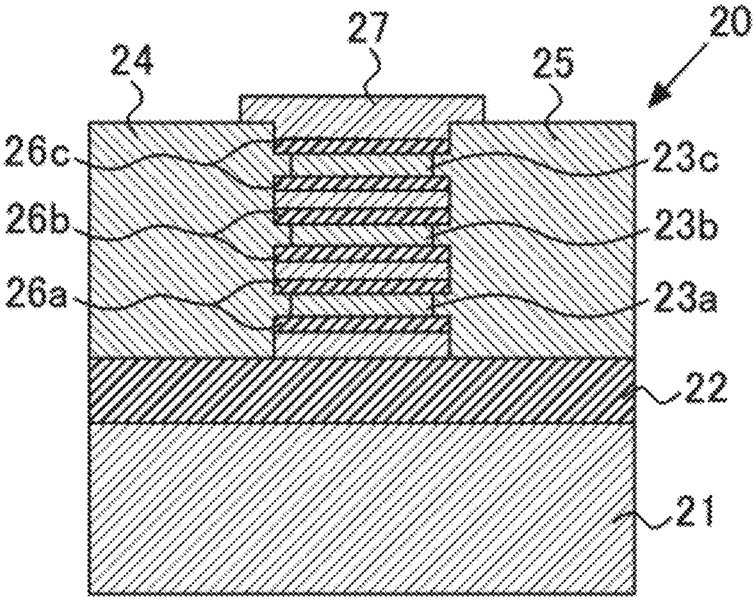

As shown in FIGS. 8($a$) and 8($b$), for example, the semiconductor element 20 can be formed on any substrate such as an SOI substrate in which a surface insulating layer 22 is formed on a semiconductor layer 21, but the semiconductor layer 21 and the surface insulating layer 22 are optional structures which are not involved in the operation of the semiconductor element 20.

The semiconductor element 20 according to the second embodiment is different structurally from the semiconductor element 10 according to the first embodiment in that the channel part 13 is comprised of the channel parts 23$a$ to 23$c$. Differences will be described below.

Each of the channel parts 23$a$ to 23$c$ is formed of the indirect transition-type semiconductor, and is comprised of the plate-like shaped portion itself having one end connected to the source part 24 and the other end connected to the drain part 25.

Of two pairs of opposing surfaces of the first opposing surfaces and the second opposing surfaces which constitute the plate-like shaped portion of the channel part 23$a$ and are opposed in a direction perpendicular to the direction in which a current flows from the source part 24 to the drain part 25, at least one pair of the opposing surfaces (opposing surfaces facing each other in the Z direction in FIG. 7) constitutes the electron confinement surfaces. The thickness $D_2$ (refer to FIG. 8($a$)) of the channel part 23$a$ in the Z direction in FIG. 7, which determines the facing interval between these electron confinement surfaces, is made 15 nm at the longest, and the channel part 23$a$ is configured to obtain the convolution effect.

Further, the channel parts 23$b$ and 23$c$ each have the same structure as the channel part 23$a$ and are arranged side by side with the channel part 23$a$.

That is, in the semiconductor element 20, a plurality of the plate-like shaped portions from which the convolution effect is obtained are arranged to obtain a larger tunnel current than in the single plate-like shaped portion.

The thin layering of the channel parts 23$a$ to 23$c$ for obtaining the convolution effect provides room for forming a plurality of the plate-like shaped portions in the same formation region as in the case of forming the channel parts in a bulk state.

From this point of view, preferably, as shown in the figure, each of the channel parts 23$b$ and 23$c$ takes the facing interval in the channel part 23$a$ to be 15 nm at the longest and is the plate-like shaped portion itself (or the channel part having the plate-like shaped portion) arranged side by side with the channel part 23$a$ in the direction (Z direction in FIG. 7) in which the opposing surfaces formed by the electron confinement surfaces are opposed to each other.

In the channel parts 23$a$ to 23$c$ configured in this way, the entire exposed portions thereof except for the connection surfaces with the source part 24 and the drain part 25 are covered with gate insulating films 26$a$ to 26$c$, respectively, and are covered with a gate electrode 27 via the gate insulting films 26$a$ to 26$c$.

Incidentally, in the present example, both of the channel parts 23$b$ and 23$c$ arranged side by side with the channel part 23$a$ are configured to obtain the convolution effect, but only either one of them may be configured to obtain the convolution effect.

Further, the matters described for the semiconductor element 10 according to the first embodiment can be applied as matters other than the above.

Next, description will be made about an example of the method for manufacturing the semiconductor element of the present invention with reference to the drawings.

FIGS. 9 to 15 are the figures (1) to (7) each showing the manufacturing process of the semiconductor element 10 according to the first embodiment, and (b) of each figure is a cross-sectional view taken along line A-A in (a) of each figure.

Figure 9A:
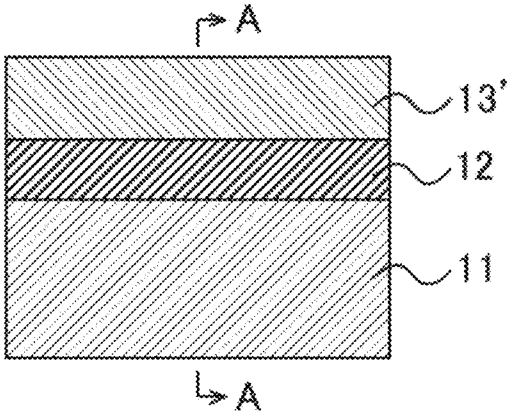
FIG. 9(*a*) is a figure (1) showing a manufacturing process of the semiconductor element 10 according to the first embodiment.
Figure 9B:
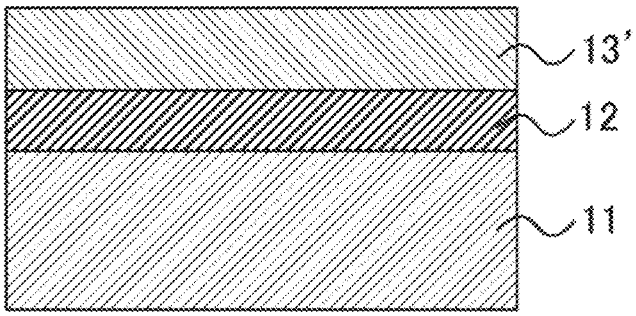

First, an SOI substrate is prepared in which a $SiO_2$ surface insulating layer (BOX layer) 12 having a thickness of 145 nm and an SOI layer 13' formed of Si with a thickness of 50 nm are formed in this order on an Si semiconductor layer 11 for a handle (refer to FIGS. 9($a$) and 9($b$)). The SOI layer 13' is doped with a p-type impurity of about $1\times10^{15}$ $cm^{-3}$.

Figure 10A:
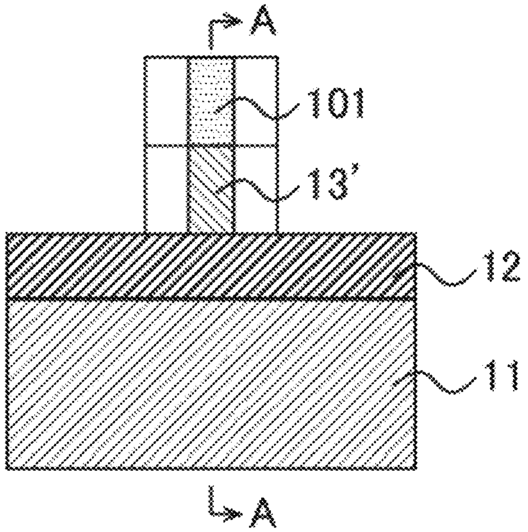
FIG. 10(*a*) is a figure (2) showing a manufacturing process of the semiconductor element 10 according to the first embodiment.
Figure 10B:
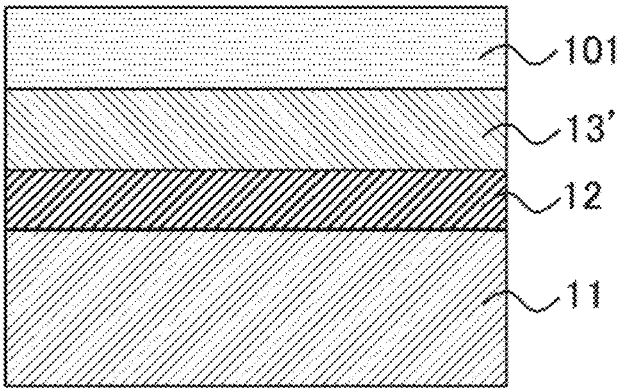

Next, after forming an etching mask 101 with a thickness of 65 nm at a predetermined position on the SOI layer 13' by electron beam lithography, reactive ion etching (RIE) is performed using the etching mask 101 as a mask to process the shape of the SOI layer 13' into the shapes of a channel part 13, a source part 14, and a drain part 15 (refer to FIGS. 10($a$) and 10($b$)). As a plasma in the reactive ion etching (RIE), a plasma of hydrogen bromide (HBr), a mixed plasma of hydrogen bromide (HBr) and chorine ($Cl_2$), and a mixed plasma of hydrogen bromide (HBr) and argon (Ar), etc. are used.

Figure 11A:
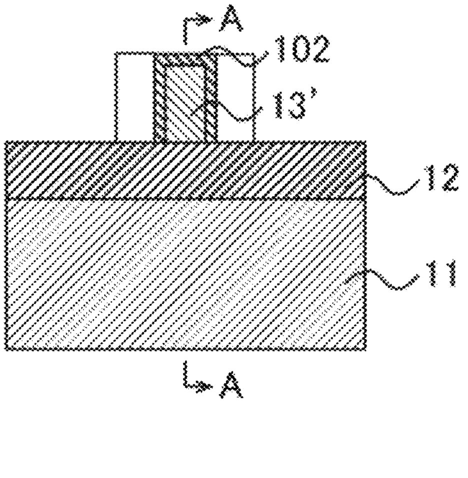
FIG. 11(*a*) is a figure (3) showing a manufacturing process of the semiconductor element 10 according to the first embodiment.
Figure 11B:
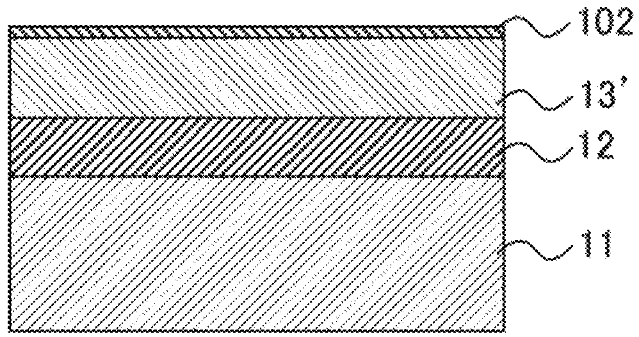
Figure 12A:
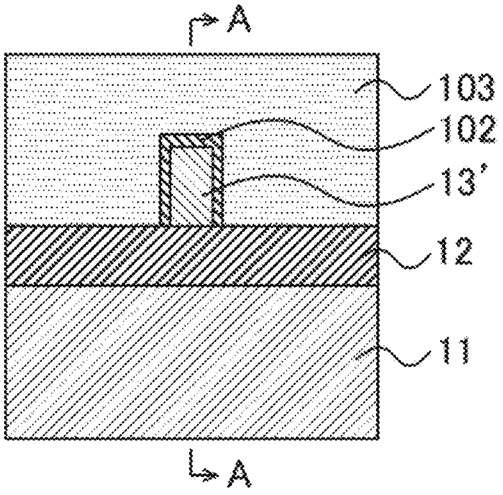
FIG. 12(*a*) is a figure (4) showing a manufacturing process of the semiconductor element 10 according to the first embodiment.
Figure 12B:
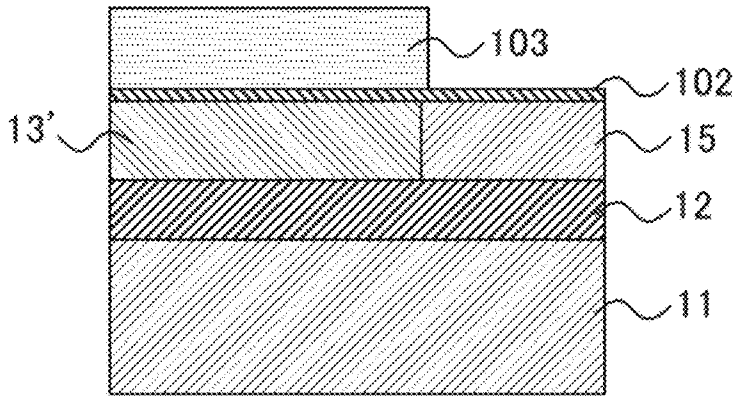
Figure 13A:
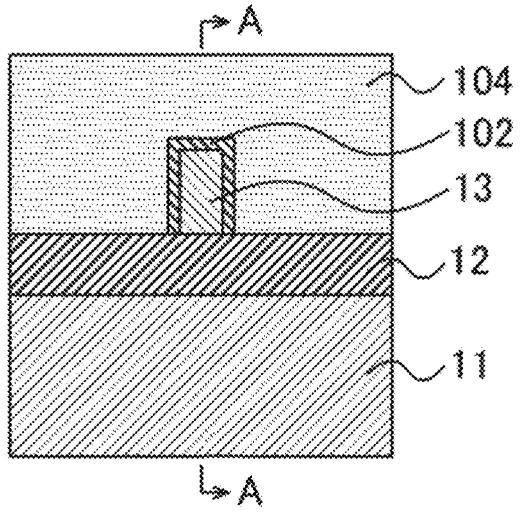
FIG. 13(*a*) is a figure (5) showing a manufacturing process of the semiconductor element 10 according to the first embodiment.
Figure 13B:
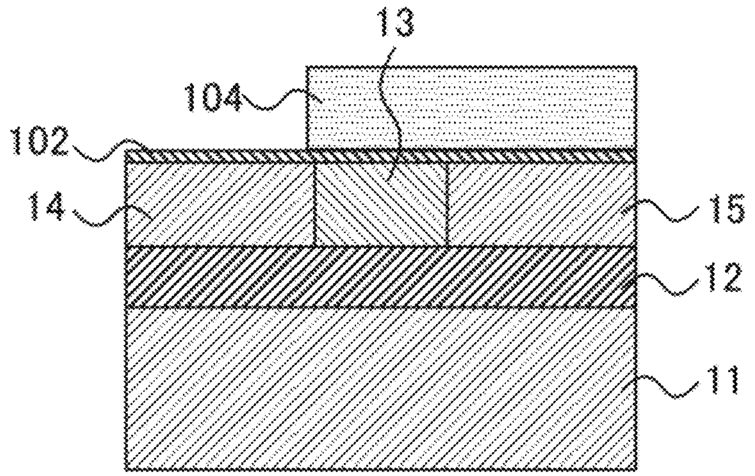

Next, after removing the etching mask 101, a $SiO_2$ protective oxide film 102 having a thickness of 4 nm is formed on the surface of the SOI layer 13' for subsequent ion implantation (refer to FIGS. 11($a$) and 11($b$)).

Next, a resist layer 103 having a thickness of 100 nm is formed on the protective oxide film 102 by the electron beam lithography. Using the resist layer 103 as a mask, ion implantation using $BF_2$ is performed at an acceleration energy of 5 keV and a dose amount of $2\times10^{15}$ $cm^{-2}$ to form the drain part 15 as the drain region in the SOI layer 13' (refer to FIGS. 12($a$) and 12($b$)).

Next, the resist layer 103 is removed by oxygen ashing processing, and the surface thereof is cleaned with SPM (Sulfuric Acid Peroxide Mixture). In the SPM cleaning, a mixture of $H_2SO_4$ and $H_2O_2$ at a ratio of 3:1 is used as cleaning liquid.

Next, a resist layer 104 having a thickness of 100 nm is formed on the SPM-cleaned protective oxide film 102. Using the resist layer 104 as a mask, ion implantation using As is performed at an acceleration energy of 5 keV and a dose amount of $2\times10^{15}$ $cm^{-2}$ to form the source part 14 as the source region in the SOI layer 13' (refer to FIGS. 13($a$) and 13($b$)).

A remaining portion of the SOI layer 13' in which the source part 14 and the drain part 15 are formed constitutes the channel part 13.

Next, the resist layer 104 is removed by oxygen ashing processing, and the surface thereof is cleaned with SPM. In the SPM cleaning, a mixture of $H_2SO_4$ and $H_2O_2$ at a ratio of 3:1 is used as the cleaning liquid.

Next, activation annealing processing is performed at a temperature of 1,000° C. for 1 second under the atmospheric pressure of $N_2$ gas atmosphere to activate each impurity material in the source part 14 and the drain part 15.

Next, the protective oxide film 102 is removed using dilute hydrofluoric acid (DHF) with a concentration of 1%.

Next, the SOI substrate is immersed in an SC2 cleaning solution (mixed solution of HCl, $H_2O_2$ and $H_2O$ at a ratio of 1:1:6) at a temperature condition of 70° C. for 5 minutes for cleaning.

Figure 14A:
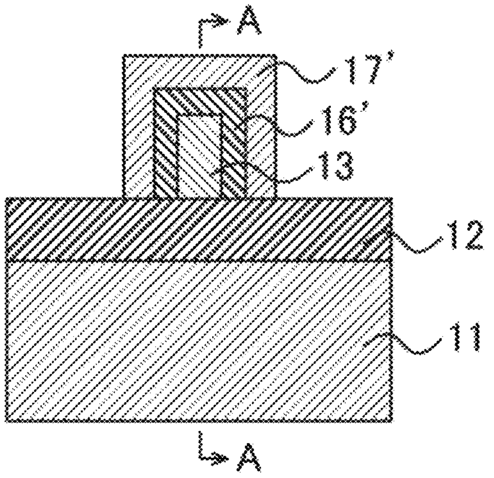
FIG. 14(*a*) is a figure (6) showing a manufacturing process of the semiconductor element 10 according to the first embodiment.
Figure 14B:
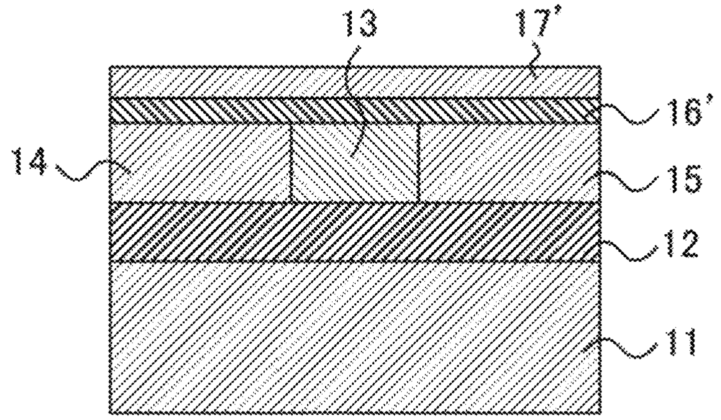

Next, using an ALD method, $HfO_2$ is deposited under a temperature condition of 250° C. to form a gate insulating film forming film 16' having a thickness of 2.4 nm around the channel part 13, and to form a TaN gate electrode forming layer 17' having a thickness of 30 nm on the gate insulating film forming film 16' by sputtering method (refer to FIGS. 14(*a*) and 14(*b*)).

Figure 15A:
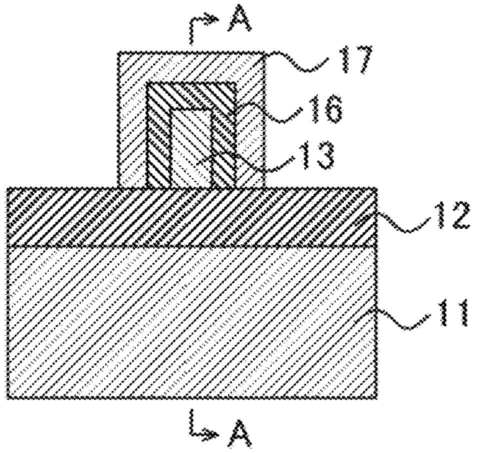
FIG. 15(*a*) is a figure (7) showing a manufacturing process of the semiconductor element 10 according to the first embodiment.
Figure 15B:
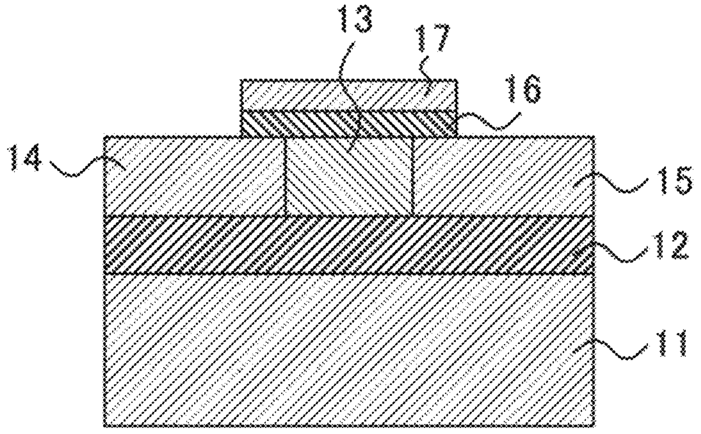

Next, the gate insulating film forming film 16' and the gate electrode forming layer 17' are processed in shape by reactive ion etching processing with $Cl_2$ plasma using a mask to form a gate insulating film 16 and a gate electrode 17 (refer to FIGS. 15(*a*) and 15(*b*)).

As described above, the semiconductor element 10 is manufactured.

Incidentally, this manufacturing method shows an example of the manufacturing method of the semiconductor element 10. A user can appropriately select suitable manufacturing equipment and manufacture the semiconductor element by the known method.

An important matter in manufacturing the semiconductor element 10 is to secure the electron confinement surface in the channel part 13.

This point can be easily implemented by selecting the crystal plane orientation (crystal axis direction perpendicular to the substrate) of the SOI substrate which serves as a start substrate, and the extending direction of the channel part 13.

Figure 16A:
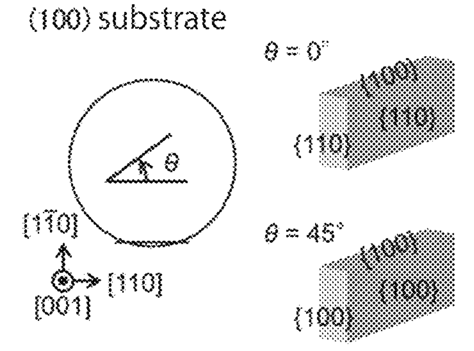
FIG. 16(*a*) is a view showing an overview of a method of forming a channel part using an SOI substrate having a (100) plane as a principal surface.
Figure 16B:
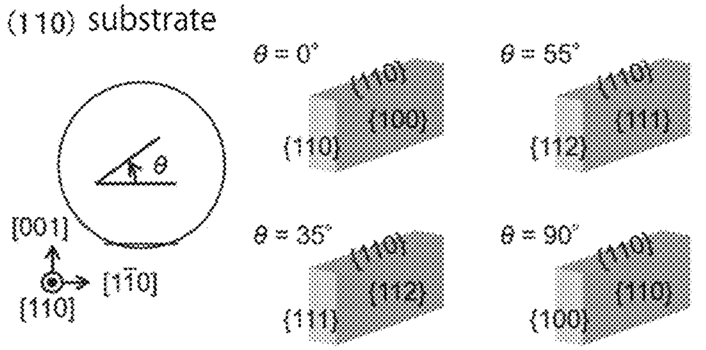

For example, as shown in FIG. 16(*a*), the structure for obtaining the convolution effect in the <100> direction in silicon can be obtained by using the SOI substrate with the (100) plane as the principal surface, and aligning the extending direction of the channel part 13 with a [110] direction notch portion (orientation flat or notch indicated by a horizontal line in the lower part of a circle in the figure) in the SOI substrate in a 45 degree (or its equivalent) direction.

Further, for example, as shown in FIG. 16(*b*), the structure for obtaining the convolution effect in the <111> direction in germanium can be obtained by using a GOI (Germanium-on-insulator) substrate with the (110) plane as the principal surface, and aligning the extending direction of the channel part 13 with a [110] direction notch portion (orientation flat or notch indicated by a horizontal line in the lower part of a circle in the figure) in the GOI substrate in a 55 degree (or its equivalent) direction.

Incidentally, FIG. 16(*a*) is a view showing an overview of a method of forming a channel part using an SOI substrate having a (100) plane as a principal surface, and FIG. 16(*b*) is a view showing an overview of a method of forming a channel part using a GOI substrate having a (110) plane as a principal surface.

Next, an example of the method for manufacturing the semiconductor element of the present invention related to the semiconductor element 20 according to the second embodiment will be described with reference to the drawings.

Figure 17A:
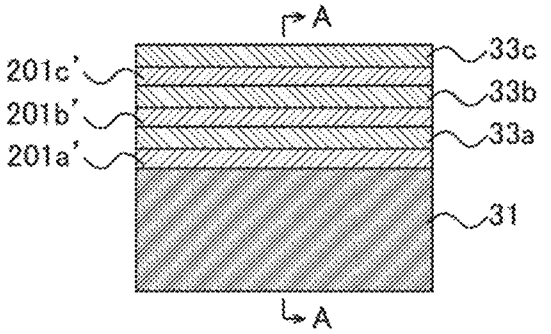
FIG. 17(*a*) is a figure (1) showing a manufacturing process of the semiconductor element of the present invention related to the semiconductor element 20 according to the second embodiment.
Figure 17B:
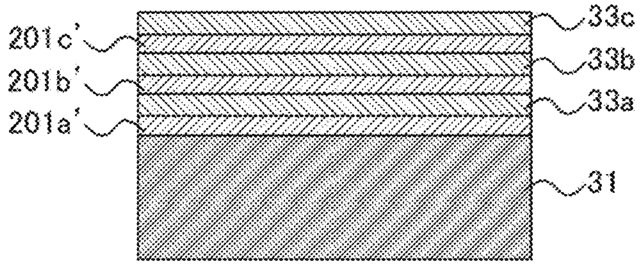
Figure 18A:
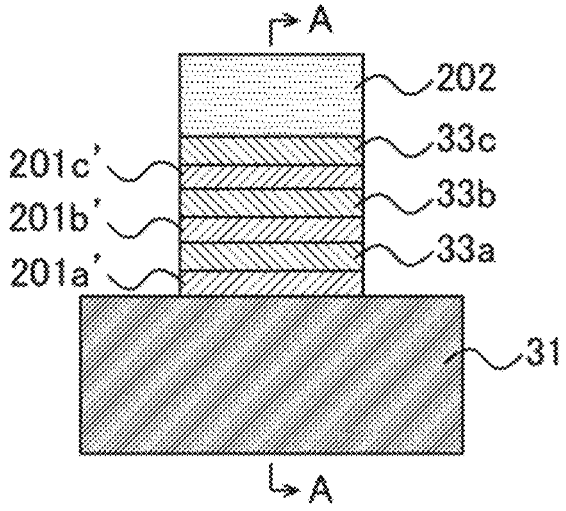
FIG. 18(*a*) is a figure (2) showing a manufacturing process of the semiconductor element of the present invention related to the semiconductor element 20 according to the second embodiment.
Figure 18B:
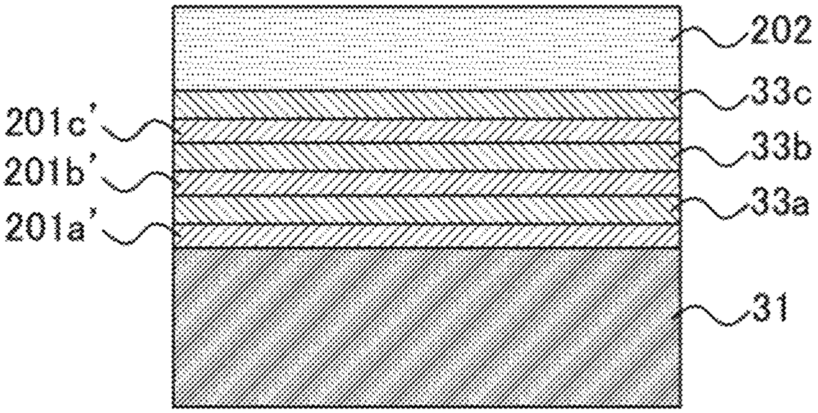
Figure 19A:
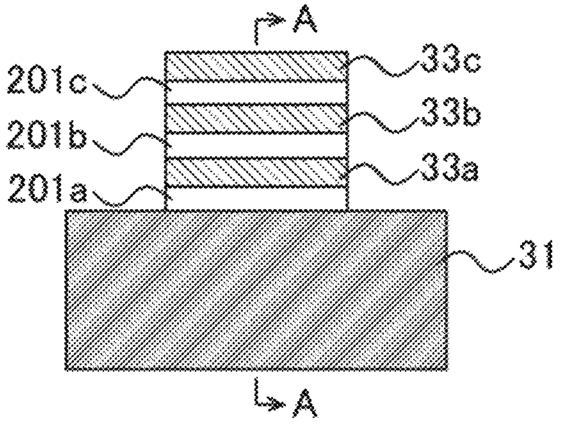
FIG. 19(*a*) is a figure (3) showing a manufacturing process of the semiconductor element of the present invention related to the semiconductor element 20 according to the second embodiment.
Figure 19B:
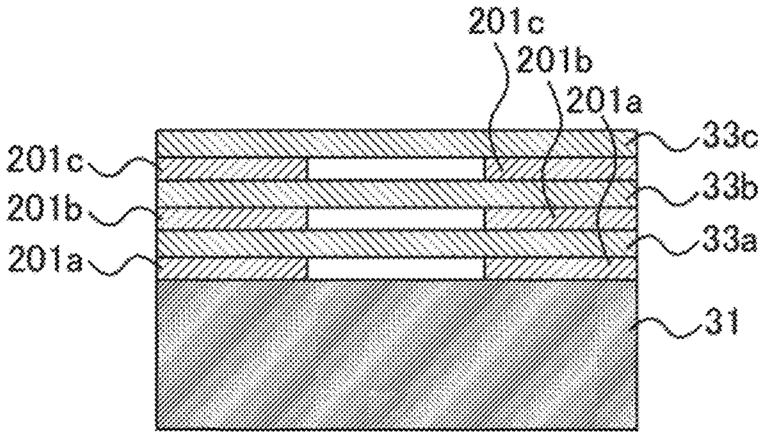

FIGS. 17 to 19 are figures (1) to (3) showing the manufacturing process of the semiconductor element of the present invention related to the semiconductor element 20 according to the second embodiment. (b) of each figure is a cross-sectional view taken along line A-A in (a) of each figure.

First, an Si substrate 31 for a handle is prepared. In this substrate 31, the crystal plane orientation similar to that of the SOI substrate is selected based on the matters described using FIG. 16(*a*) about the SOI substrate, so that the electron confinement surface can be easily secured in each subsequent process.

A silicon-germanium sacrificial layer 201*a*', an Si semiconductor layer 33*a*, a silicon-germanium sacrificial layer 201*b*', an Si semiconductor layer 33*b*, a silicon-germanium sacrificial layer 201*c*', and an Si semiconductor layer 33*c* are formed on the substrate 31 in this order by an epitaxial growth method (refer to FIGS. 17(*a*) and 17(*b*)). The thickness of each of the Si semiconductor layers 33*a* to 33*c* is set to 15 nm at the thickest according to the thickness $D_2$ (refer to FIG. 8(*a*)) of the channel part 23*a* in the semiconductor element 20 according to the second embodiment. The thickness can be controlled by adjusting an epitaxial growth time.

Next, the shapes of the silicon-germanium sacrificial layers 201*a*' to 201*c*' and the Si semiconductor layers 33*a* to 33*c* are processed by lithography processing using a mask 202 (refer to FIGS. 18(*a*) and 18(*b*)).

Next, the central portion of the silicon-germanium sacrificial layer 201*a*' is selectively etched by the hydrogen peroxide solution ($H_2O_2$) so as to divide the silicon-germanium sacrificial layer 201*a*' into two silicon-germanium sacrificial layers 201*a*. At the same time, the silicon-germanium sacrificial layers 201*b*' and 201*c*' are similarly etched. At this time, the etching rate of the hydrogen peroxide solution ($H_2O_2$) to the Si semiconductor layers 33*a* to 33*c* is sufficiently slower than the etching rate thereof to the silicon-germanium sacrificial layers 201*a*' to 201*c*'. Consequently, only the Si semiconductor layers 33*a* to 33*c* are in a crosslinked state without being divided, so that the formation of the channel part becomes possible (refer to FIGS. 19(*a*) and 19(*b*)).

As for matters other than this, based on the matters described in the semiconductor element 10 according to the first embodiment and/or the known method of manufacturing the semiconductor element, the semiconductor device according to the element configuration of the semiconductor element 20 according to the second embodiment can be manufactured.

(Semiconductor Integrated Circuit)

A semiconductor integrated circuit of the present invention has the semiconductor element of the present invention.

A method for integrating the semiconductor elements is not particularly limited and can be appropriately selected according to the purpose, and the known methods can be adopted as appropriate.

EXAMPLES (Simulation)

A simulation was carried out as follows regarding changes in energy band structure and changes in band-to-band tunnel current caused by making silicon being the indirect transition-type semiconductor into a two-dimensional plate shape.

<Changes in Energy Band Structure>

As targeting two of bulk-like silicon which is infinite in thickness and plate-like silicon with a thickness of about 1.1 nm, each having a thickness direction being a <100> direction, a simulation test on the changes in energy band structure was performed.

Specifically, a simulation test was conducted as follows.

First, the energy band structure of silicon was obtained by the first principle calculation based on the density functional theory.

The calculation software VASP (Vienna Ab Initio Simulation Package) version 5.4 was used for the calculation.

Generalized Gradient Approximation (GGA) and PBE (Perdue-Burke-Ernzerhof) format were used for the exchange correlation functional describing the interaction of electrons.

The wave function of valence electrons is represented by the superposition of plane waves and considered up to the wavenumbers corresponding to kinetic energy of up to 500 eV. The interaction of core electrons with valence electrons was expressed using the pseudopotential of the PAW (Projector Augmented Wave) method.

Here, the plate-like silicon whose thickness is about 1.1 nm was prepared assuming, with a structure in which eight layers made of two atoms per layer were stacked as a basic unit, a system in which the basic unit was repeated infinitely periodically in an in-plane direction. At this time, it was assumed that both the upper and lower surfaces in the thickness direction of the silicon were terminated with hydrogen, and that a vacuum layer having a thickness of 2 nm or more existed on the outside thereof.

On the other hand, bulk-like silicon was prepared assuming, with a structure in which four layers made of two atoms per layer were stacked as a basic unit, a system in which the basic unit was repeated infinitely periodically in the in-plane and perpendicular directions.

Figure 20A:
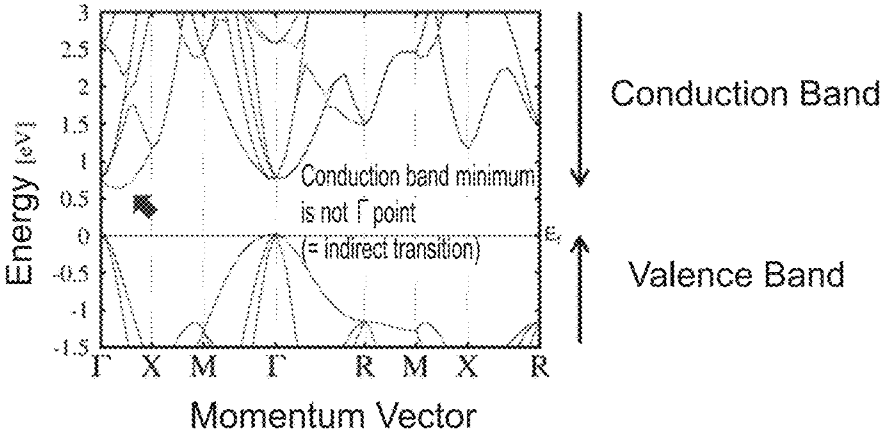
FIG. 20(*a*) is a view showing an energy band structure of bulk-like silicon.
Figure 20B:
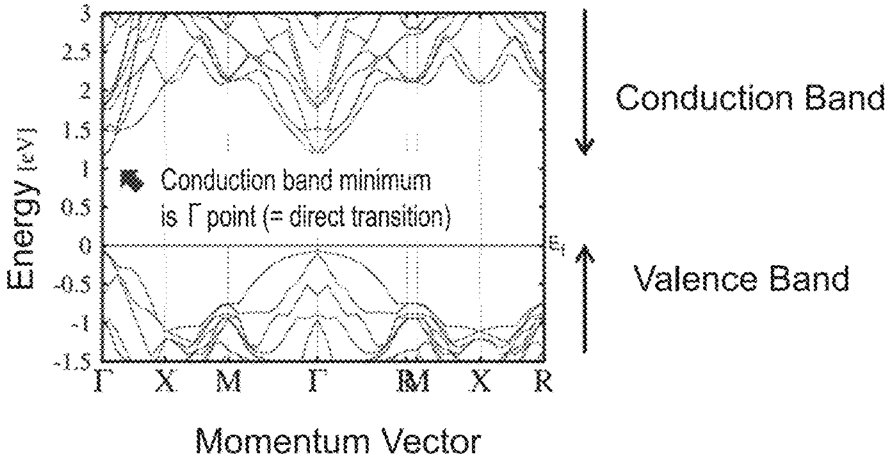

There is shown in FIG. 20(*a*), the energy band structure of bulk-like silicon obtained by the simulation test. Also, there is shown in FIG. 20(*b*), the energy band structure of the plate-like silicon with the thickness of about 1.1 nm.

As shown in FIG. 20(*a*), in the bulk-like silicon, the uppermost end of the valence band is located at a Γ point which means zero momentum, whereas the lowermost end of the conduction band is located at a point different from the Γ point. In other words, the direct characteristics of the indirect transition-type semiconductor are shown.

On the other hand, as shown in FIG. 20(*b*), in the plate-like silicon whose thickness is about 1.1 nm, both the valence band uppermost end and the conduction band lowermost end are located at the Γ point. In other words, it can be seen that silicon, which is originally the indirect transition-type semiconductor, is transformed into a direct transition-type semiconductor simulatively by being formed into a thin plate-like shape.

Figure 21:
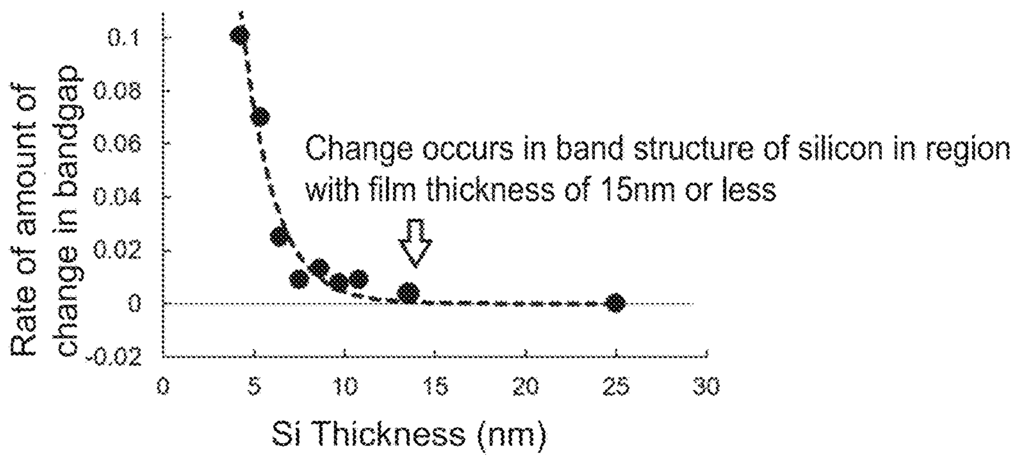
FIG. 21 is a view showing the correlation between the energy band structure of silicon and the thickness of silicon.

Subsequently, there is shown in FIG. 21, the correlation between the energy band structure of silicon and the silicon film thickness obtained by using the same method as the first principle calculation. However, here, the kinetic energy of the wavenumber of the plane wave representing the wave function was assumed to be 550 eV at maximum, and the thickness of the vacuum layer outside the silicon thin film was assumed to be 1.1 nm. The vertical axis in FIG. 21 represents the difference between the bandgap (energy difference between the uppermost end of the valence band and the lowermost end of the conduction band, $Eg_{thin}$) and the bandgap of the bulk-like silicon (energy difference between the uppermost end of the valence band and the lowermost end of the conduction band, $Eg_{bulk}$) when changing the thickness of the plate-like silicon in the simulation test, at a ratio to the bandgap of the bulk-like silicon ($=\{Eg_{thin}-Eg_{bulk}\}/Eg_{bulk}$). Also, the horizontal axis indicates the thickness of the plate-like silicon.

Since the change in the bandgap of silicon occurs due to the mixing of the electron orbits of the component related to the indirect transition and the component related to the direct transition, the change in the bandgap due to thinning results in supporting the enhancement of the component related to the direct transition.

As shown in FIG. 21, when the thickness of the plate-like silicon becomes 15 nm or less, it is confirmed that the band structure of silicon begins to change, and the component related to the direct transition is enhanced.

<Band-to-Band Tunnel Current>

Next, a simulation test on the change in band-to-band tunnel current was conducted.

Targets for this simulation test were assumed to be the following two thinned TFET and bulk TFET.

Figure 22:
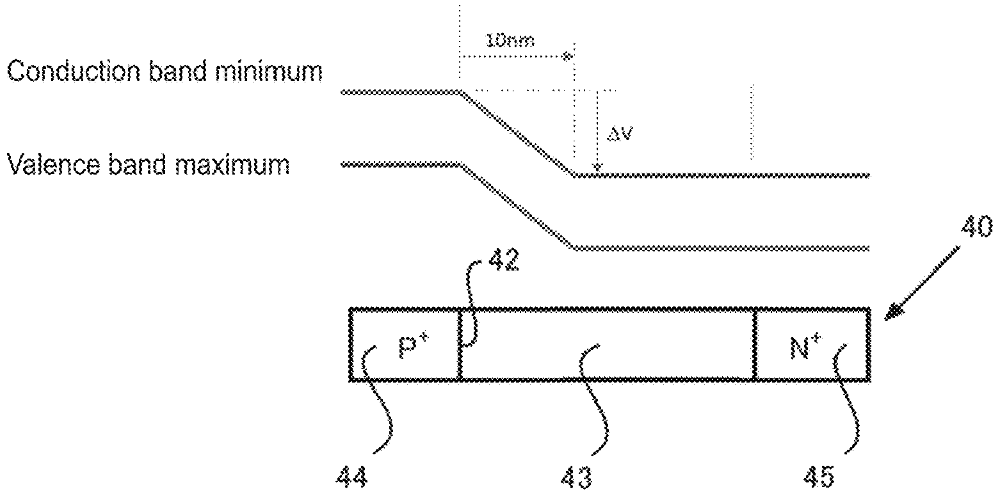
FIG. 22 is an explanatory view for describing the configuration of a thinned TFET, which is a target for a simulation test.

First, as shown in FIG. 22, the thinned TFET uses as base material, a silicon plate 40 whose thickness direction is the <100> direction, whose thickness is uniform at 1.1 nm, and whose front and back surfaces are {100} planes, and is constituted as a constituent member in which a channel region 43 is formed between a source region 44 formed on one longitudinal end side and a drain region 45 formed on the other longitudinal end side. At this time, it was assumed that both the upper and lower surfaces in the thickness direction were terminated with hydrogen, and that a vacuum layer having an infinitely large thickness existed on the outer side thereof.

Here, the source region 44 is P-type silicon, and the impurity concentration was set to about $5\times10^{19}$ $cm^{-3}$ so that the energy coincided between the Fermi level and the upper end of the valence band.

Also, the drain region 45 is N-type silicon, and the impurity concentration was set to about $5\times10^{19}$ $cm^{-3}$ so that the energy coincided between the Fermi level and the lower end of the conduction band.

Further, the channel region 43 is silicon and was set to have no impure material added thereto.

Also, the tunnel junction 42 was set as a semiconductor junction constituted by a junction between semiconductors of the source region 44 and the channel region 43.

Further, the source region 44 is connected to a metal electrode (source electrode) not shown in the figure, and the junction between the metal electrode and the source region 44 was set as an ideal ohmic junction.

The drain region 45 is also similarly connected to a metal electrode (drain electrode) not shown in the figure, and the junction between the metal electrode and the drain region 45 was set as an ideal ohmic junction.

Incidentally, FIG. 22 is an explanatory diagram for describing the configuration of the thinned TFET, which is the target for the simulation test.

The thinned TFET is set to operate by inputting an electric field applied to the channel region 43 by an arbitrary gate insulating film and gate electrode instead of inputting a gate voltage.

The electric field was set to be applied to a portion of the channel region 43 from the position of the tunnel junction 42 to a position 10 nm away in the extending direction of the channel region 43 toward the drain region 45. Since the concentration of the impurity substance is high, the source region 44 was set assuming that no electric field was applied. Incidentally, based on this setting, the electric field (E) applied to the tunnel junction 42 is set by the following formula: electric field (E)=voltage drop (ΔV)/distance (=10 nm).

In the portion of the channel region 43 which is separated from the position of the tunnel junction 42 by a distance longer than 10 nm in the extending direction, no electric field is applied, and the energies of the Fermi level and the lower end of the conduction band coincide, so that the portion was set as being connected to the drain region 45 without barriers.

Next, the bulk TFET was set in the same manner as the thinned TFET, except that the thickness of the silicon plate 40 was changed from 1.1 nm to infinite in the thinned TFET.

In the simulation test, these two TFETs are targeted, and the band-to-band tunnel currents in these two TFETs are confirmed by comparing the band-to-band tunnel currents with the input value of the electric field as a variable.

In this simulation test, in Reference 2 described below, the same calculation software as used for calculating the band-to-band tunnel current for bulk-like silicon and compound semiconductors containing intermediate impurity levels was used to calculate the band-to-band tunnel current.

Here, the current intensity was determined by calculating the transmission coefficient of the non-equilibrium Green's function. The sp3s* orbitals of silicon atoms based on the tight-binding approximation were adopted as the basis for expressing the electron wavefunction and density. The orbital energy and interatomic jump energy of electrons used in the tight-binding approximation were decided so as to reproduce the band structure of bulk silicon (refer to FIG. 20(*a*)) and the known bandgap energy of silicon (1.1 eV) obtained by experiments. Using this tight-binding approximation, the energy band structure of a thin film with a thickness of 1.1 nm was obtained, and the tunnel current was calculated using it. The interaction of electrons tunneling through a pn junction interface was described by the Green's function of electrons in the electrode, between the electrode and the semiconductor, and in the semiconductor itself.

Reference 2: Sanghun Cho, Takashi Nakayama, "Enhancement of Tunneling Currents by Resonant Impurity States in p/n Junction: Comparison of Direct and Indirect Bandgap Systems" Proceedings of 26th Workshop on Electron Device Interface Technology, pp. 109-113, January 2021.

Figure 23:
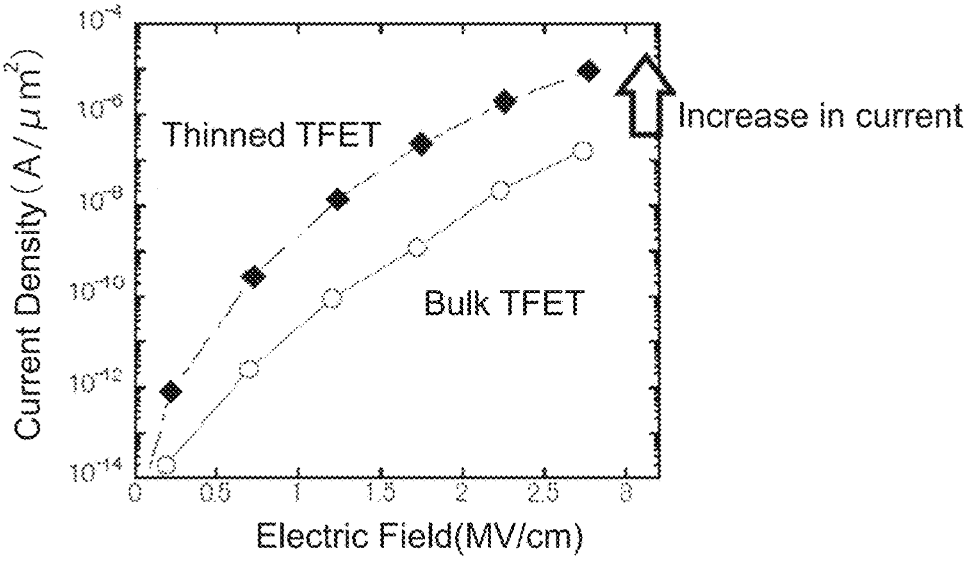
FIG. 23 is a view showing simulation test results of a band-to-band tunnel current.

The simulation test results of the band-to-band tunnel current are shown in FIG. 23. In FIG. 23, the tunnel current begins to flow when a current of $1\times10^{-15}$ A/μm is made conductive. The electric field at which the tunnel current begins to flow is set to 0 MV/cm as a threshold electric field, and the electric field on the horizontal axis is represented by the difference from the threshold electric field.

As shown in FIG. 23, it is confirmed that the band-to-band tunnel current is significantly increased in the thinned TFET as compared to the bulk TFET.

As described above, in the semiconductor element of the present invention, the channel part formed of the indirect transition-type semiconductor can be brought into the direct transition-type semiconductor simulatively to increase the tunnel current.

In order to confirm the effectiveness of the simulation results and the effects brought about by the present invention, the semiconductor element was manufactured and its performance was evaluated. A specific description will be made below.

Example 1

A semiconductor element according to Example 1 was manufactured according to the configuration of the semiconductor element 10 according to the first embodiment shown in FIGS. 5(*a*) and 5(*b*).

The semiconductor element according to Example 1 relates to a trial production for confirming effectiveness. This relates to the element of the back gate structure utilizing the semiconductor layer 11 (refer to FIGS. 5(*a*) and 5(*b*)) as the gate electrode without forming the gate insulating film 16 and the gate electrode 17 in the semiconductor element 10 according to the first embodiment. Although it is assumed that the semiconductor element according to Example 1 having the back gate structure provides an obtained on-current smaller than the semiconductor element 10 according to the first embodiment having the gate insulating film 16 and the gate electrode 17, switching characteristics and various conditions for obtaining a large tunnel current and tunnel current density are common to the semiconductor element 10 according to the first embodiment. The results of confirming the effectiveness for the semiconductor element according to Example 1 strongly support the effectiveness of the semiconductor element of the present invention inclusive of the semiconductor element 10 according to the first embodiment.

The semiconductor element according to Example 1 was manufactured as follows by a manufacturing method similar to the method described with reference to FIGS. 9 to 13(*b*). Incidentally, the reference numerals in the description are common to the reference numerals in FIGS. 9 to 13(*b*).

First, an SOI substrate was prepared in which an $SiO_2$ surface insulating layer (BOX layer) 12 having a thickness of 145 nm and an SOI layer 13' formed of Si to a thickness of 50 nm were formed in this order on an Si semiconductor layer 11 for a handle (refer to FIGS. 9(*a*) and 9(*b*)). The SOI layer 13' is doped with a p-type impurity of about $1\times10^{15}$ $cm^{-3}$.

Here, as the SOI substrate, one having the (100) plane as a principal surface is used, and in subsequent manufacturing processes, the extending direction of the channel part 13 is aligned in a 45-degree direction with the notch portion in the [110] direction of the SOI substrate to cause the formed channel part 13 to have the electron confinement surface (refer to FIG. 16(*a*)).

Next, after forming an etching mask 101 with a thickness of 65 nm at a predetermined position on the SOI layer 13' by the electron beam lithography, reactive ion etching (RIE) was performed using the etching mask 101 as a mask to process the shape of the SOI layer 13' into the shapes of the channel part 13, the source part 14 and the drain part 15 (refer to FIGS. 10(*a*) and 10(*b*)). A mixed plasma of hydrogen bromide (HBr) and argon (Ar) was used as the plasma in the reactive ion etching (RIE).

Here, the shape processing of the SOI layer 13' was performed by adjusting the setting of the reactive ion etching (RIE) so that a Fin width (corresponding to the thickness $D_1$ in FIG. 5(*a*)) of the channel part 13 in the subsequent process became 14 nm. That is, considering the thickness of 4 nm of the $SiO_2$ protective oxide film 102 to be formed in the next process, the setting of the reactive ion etching (RIE) was adjusted so that the thickness of the SOI layer 13' became 18 nm.

Next, after removing the etching mask 101, a $SiO_2$ protective oxide film 102 having a thickness of 4 nm was formed on the surface of the SOI layer 13' for subsequent ion implantation (refer to FIGS. 11(*a*) and 11(*b*)).

Next, a resist layer 103 having a thickness of 100 nm was formed on the protective oxide film 102 by the electron beam lithography. Using this resist layer 103 as a mask, ion implantation using As was conducted with an acceleration energy of 5 keV and a dose of $2\times10^{15}$ $cm^{-2}$ to form the source part 14 as the source region in the SOI layer 13'.

Next, the resist layer 103 was removed by oxygen ashing processing, and the surface was washed with SPM (Sulfuric Acid Peroxide Mixture). A mixture of $H_2SO_4$ and $H_2O_2$ at a ratio of 3:1 was used for SPM cleaning.

Next, a 100 nm-thick resist layer 104 was formed on the SPM-cleaned protective oxide film 102. Using this resist layer 104 as a mask, ion implantation using $BF_2$ was performed with an acceleration energy of 5 keV and a dose of $2\times10^{15}$ $cm^{-2}$ to form the drain part 15 as the drain region in the SOI layer 13' (refer to FIGS. 12 and 13 regarding examples of forming the source part 14 and the drain part 15).

A remaining portion of the SOI layer 13' where the source part 14 and the drain part 15 are formed constitutes the channel part 13.

Next, the resist layer 104 was removed by oxygen ashing processing, and the surface was SPM-cleaned. In the SPM cleaning, a mixture of $H_2SO_4$ and $H_2O_2$ at a ratio of 3:1 was used as a cleaning liquid.

Next, activation annealing processing was performed at a temperature of 1,000° C. for 1 second under the atmospheric pressure of $N_2$ gas atmosphere to activate each impurity substance in the source part 14 and the drain part 15.

Next, the protective oxide film 102 was removed using dilute hydrofluoric acid (DHF) with a concentration of 1%.

As described above, the semiconductor element according to Example 1 was manufactured.

In the semiconductor element according to Example 1, the Fin width of the channel part 13 (corresponding to the thickness $D_1$ in FIG. 5(*a*)) is 14 nm, and the opposing surfaces of the channel part 13 which regulate the Fin width are defined as the above-mentioned electron confinement surfaces.

Example 2

A semiconductor element according to Example 2 was manufactured in the same manner as in Example 1 except that the setting of the reactive ion etching (RIE) was changed to process the shape of the SOI layer 13' so that the Fin width became 12 nm.

Example 3

A semiconductor element according to Example 3 was manufactured in the same manner as in Example 1 except that the setting of the reactive ion etching (RIE) was changed to process the shape of the SOI layer 13' so that the Fin width became 10 nm.

Example 4

A semiconductor element according to Example 4 was manufactured in the same manner as in Example 1 except that the setting of the reactive ion etching (RIE) was changed to process the shape of the SOI layer 13' so that the Fin width became 8 nm.

Example 5

A semiconductor element according to Example 5 was manufactured in the same manner as in Example 1 except that the setting of the reactive ion etching (RIE) was changed to process the shape of the SOI layer 13' so that the Fin width became 4 nm.

Comparative Example 1

A semiconductor element according to Comparative Example 1 was manufactured in the same manner as in Example 1 except that the setting of the reactive ion etching (RIE) was changed to process the shape of the SOI layer 13' so that the Fin width became 16 nm.

Comparative Example 2

A semiconductor element according to Comparative Example 2 was manufactured in the same manner as in Example 1 except that the setting of the reactive ion etching (RIE) was changed to process the shape of the SOI layer 13' so that the Fin width became 28 nm.

Comparative Example 3

A semiconductor element according to Comparative Example 3 was manufactured in the same manner as in Example 1 except that the setting of the reactive ion etching (RIE) was changed to process the shape of the SOI layer 13' so that the Fin width became 38 nm.

<Performance Evaluation>

In evaluating the performance of each semiconductor element of Examples 1 to 5 and Comparative Examples 1 to 3, each semiconductor element was photographed with an electron microscope to confirm in advance that each setting including the Fin width was correctly realized.

Figure 24:
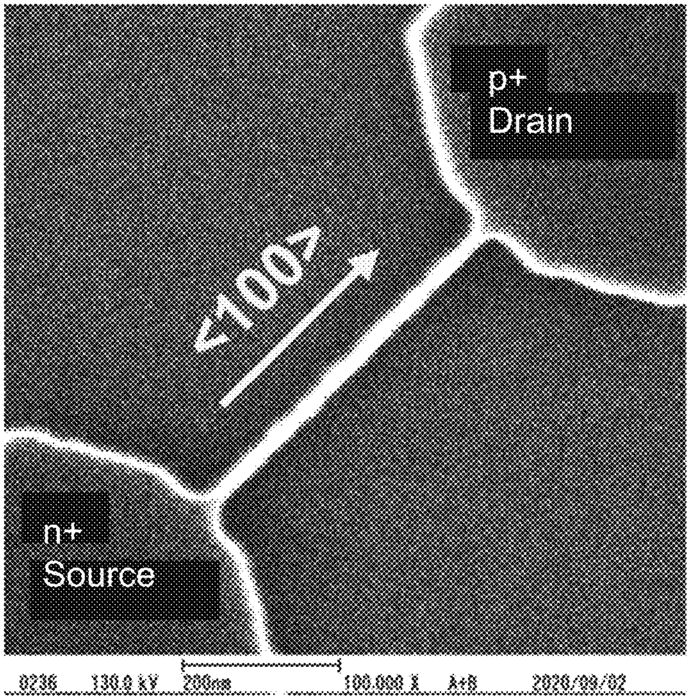
FIG. 24 is a view showing a scanning electron microscope image of a semiconductor element according to an example 4 taken from its upper surface.

As an example, a scanning electron microscope image of the semiconductor element according to Example 4 taken from its upper surface is shown in FIG. 24.

(Switching Characteristics)

Next, the switching characteristics of the respective semiconductor elements of Examples 1 to 5 and Comparative Examples 1 to 3 were measured.

The switching characteristics were measured as follows. That is, each measurement needle of a manual prober (manufactured by Micronics Japan Co., Ltd., 708 fT) connected to a semiconductor device parameter analyzer (manufactured by Agilent Technologies, Inc., B1500) was terminal-connected to the source part 14, the drain part 15, and the Si semiconductor layer 11 as the gate electrode via a metal plate (an alloy of aluminum (approximately 98 mass %) mixed with trace amounts of silicon and copper), and the drain current (tunnel current) was measured by sweeping the gate voltage at a predetermined drain voltage to measure the switching characteristics. Incidentally, the measurement was implemented under a room temperature environment.

As a result of measuring the switching characteristics of each of the semiconductor elements of Examples 1 to 5 and Comparative Examples 1 to 3, the switching characteristics of the drain current (tunnel current) between its ON and OFF states according to the gate voltage were confirmed. That is, each of the semiconductor elements of Examples 1 to 5 and Comparative Examples 1 to 3 operates as the tunnel field-effect transistor.

Figure 25:
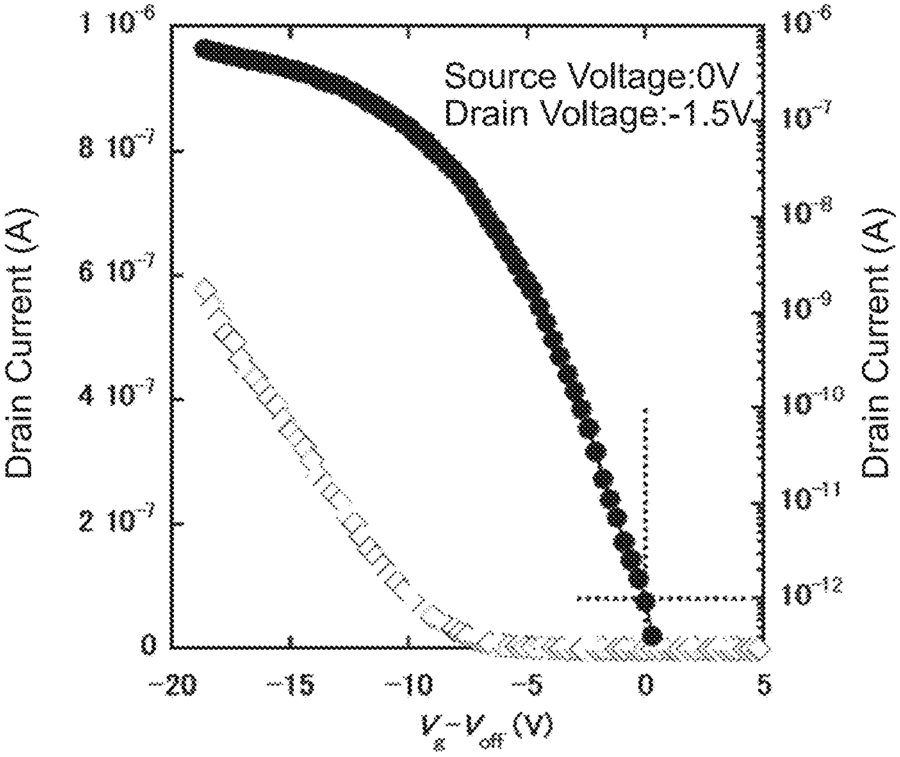
FIG. 25 is a view showing switching characteristics of the semiconductor element according to the example 4.

As an example, the switching characteristics of the semiconductor element according to Example 4 are shown in FIG. 25. Incidentally, in FIG. 25, a plot indicated by black circles indicates the drain current on the logarithmic scale of the right axis, and a plot indicated by white rhombuses indicates the drain current on the linear scale of the left axis. Also, when the drain current is $1\times10^{-12}$ A, the gate voltage is shifted to 0V as $V_{off}$ and displayed.

As shown in FIG. 25, in the semiconductor element according to Example 4, when the value of the gate voltage is increased in the negative direction from the gate voltage $V_{off}$ in the off state, it is turned to the on state and thereby the drain current flows. At this time, as can be understood from the transition of the drain current on the logarithmic scale of the right axis, the semiconductor element according to Example 4 shows a steep switching characteristic in a low voltage region, which is one of the features of the tunnel field-effect transistor. These features are features commonly seen in the semiconductor elements of Examples 2 to 5 and Comparative Examples 1 to 3.

(Tunnel Current and Tunnel Current Density)

Figure 26:
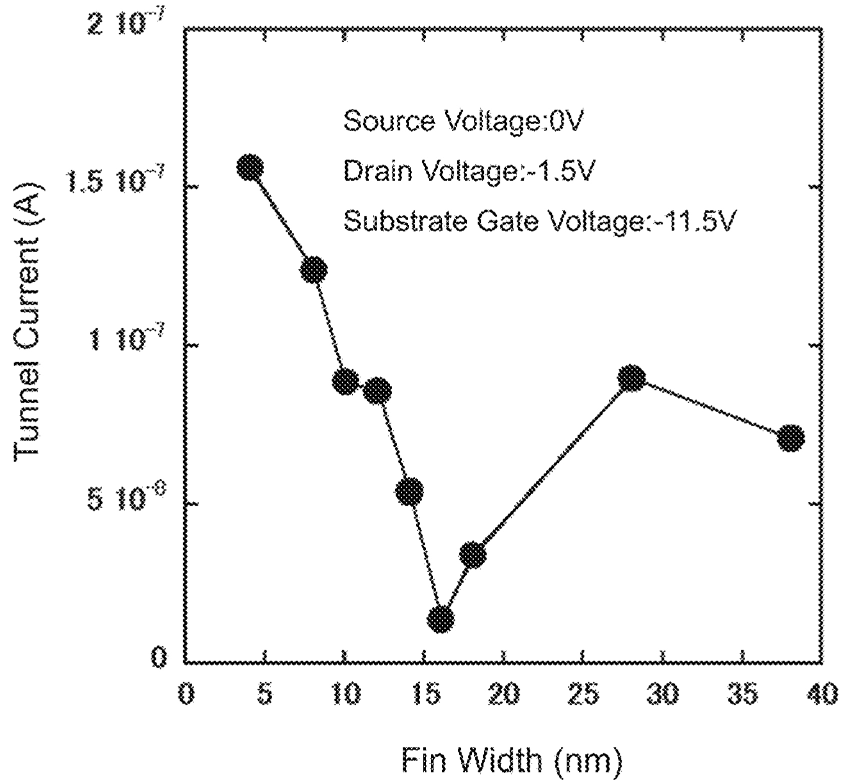
FIG. 26 is a view showing the relationship between a tunnel current and a Fin width.
Figure 27:
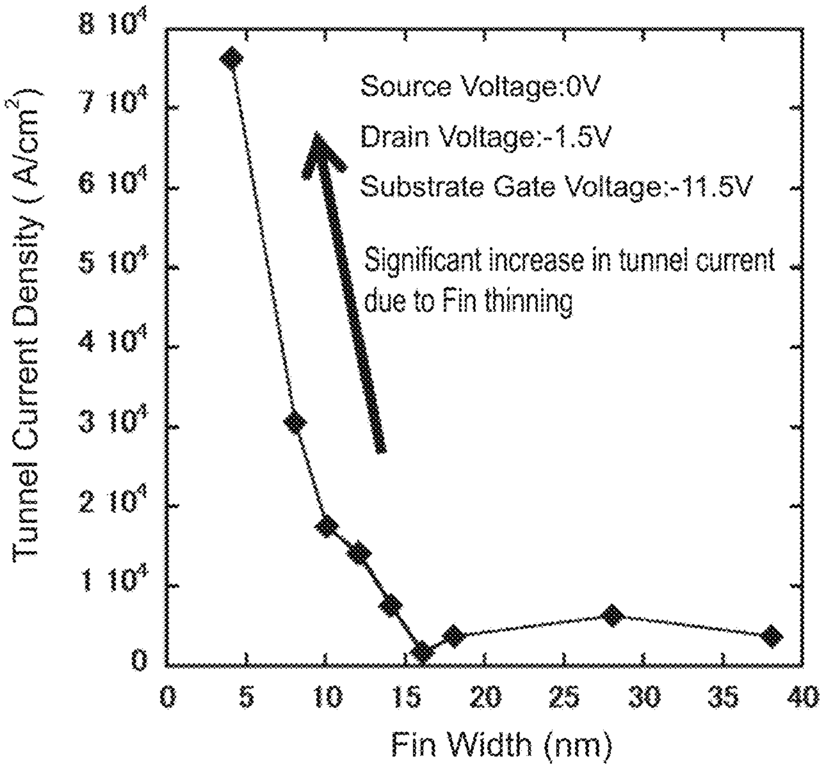
FIG. 27 is a view showing the relationship between a tunnel current density and a Fin width.

FIGS. 26 and 27 show drain currents and drain current densities of the semiconductor elements of Examples 1 to 5 and Comparative Examples 1 to 3 when the gate voltage is −11.5V in the measurement of the switching characteristics described above. FIG. 26 is a view showing the relationship between the tunnel current and the Fin width, and FIG. 27 is a view showing the relationship between the tunnel current density and the Fin width.

As shown in FIG. 26, when the Fin width is 16 nm, the drain current reaches a minimum state, and when the Fin width decreases to about 15 nm or less on a graph, the drain current tends to increase suddenly.

This phenomenon indicates that when the Fin width reaches 15 nm, the tunnel current increases in response to the confinement effect based on the conversion of the indirect transition-type semiconductor into the simulative direct transition-type semiconductor. The phenomenon clearly supports the effectiveness of the simulation results and the effects brought about by the present invention.

Further, the effect of increasing the drain current is extremely large as understood from the tunnel current density shown in FIG. 27.

In each of the semiconductor elements of Examples 1 to 5, the tunnel current is increased due to the confinement effect based on the conversion of the indirect transition-type semiconductor into the simulative direct transition-type semiconductor. It is clear that a large tunnel current can be obtained from the tunnel current in the same Fin width estimated from the decreasing tendency of the tunnel current with the decrease in the Fin width as indicated by each semiconductor element of Comparative Examples 1 to 3. Therefore, the semiconductor element according to the present invention can be evaluated as being capable of obtaining a large on-current.

In addition, in each of the semiconductor elements of Examples 1 to 5, as the Fin width decreases, the tunnel current tends to increase in reverse. Therefore, the semiconductor element according to the present invention is capable of satisfying the demand for miniaturization of the element required for high integration at the same time.

Moreover, since each of the semiconductor elements of Examples 1 to 5 can be manufactured using the existing manufacturing equipment without processing difficulties, the semiconductor element according to the present invention also has the merit of being able to be manufactured easily and at low cost while using the existing manufacturing equipment.

DESCRIPTION OF REFERENCE NUMERALS

1, 1' indirect transition-type semiconductor
2, 42 tunnel junction
10, 20 semiconductor element
11, 21 semiconductor layer
12, 22 surface insulating layer
13, 23*a*, 23*b*, 23*c* channel part
13' SOI layer
14, 24 source part
15, 25 drain part
16, 26*a*, 26*b*, 26*c* gate insulating film
16' gate insulating film forming film
17, 27 gate electrode
17' gate electrode forming layer
31 substrate
33*a*, 33*b*, 33*c* Si semiconductor layer
40 silicon plate
43 channel region
44 source region
45 drain region
102 protective oxide film
103, 104 resist layer
201*a*, 201*a'*, 201*b*, 201*b'*, 201*c*, 201*c'* silicon-germanium sacrificial layer.

The invention claimed is:

1. A semiconductor element comprising:

an element structure of a tunnel field-effect transistor; and a channel part formed of an indirect transition-type semiconductor, which is configured to have a plate-like shaped portion having one end connected to a source part and the other end connected to a drain part;

wherein the indirect transition-type semiconductor is selected from the group consisting of silicon, germanium, a mixed crystal of silicon and germanium containing less than 85 atomic percent germanium and a mixed crystal of silicon and germanium containing 85 atomic percent or more of germanium;

wherein, of two pairs of opposing surfaces of first opposing surfaces and second opposing surfaces which constitute the plate-like shaped portion and are opposed in a direction perpendicular to the direction in which a current flows from the source part to the drain part, at least one pair of the opposing surfaces selected from the two pairs is formed by arranging at a facing interval of 15 nm at the longest between the opposing surfaces, electron confinement surfaces in which a band structure of a direct transition-type semiconductor is capable of being simulatively given to the indirect transition-type semiconductor by regulation of electron motion, and wherein the electron confinement surface is constituted from any of the group consisting of a {100} plane of silicon, a {111} plane of germanium, a {100} plane of a mixed crystal of silicon and germanium containing less than 85 atomic percent germanium and a {111} plane of a mixed crystal of silicon and germanium containing 85 atomic percent or more of germanium, depending on the selection of the indirect transition-type semiconductor.

2. The semiconductor element according to claim 1, wherein all of the four constituent surfaces constituting the first opposing surfaces and the second opposing surfaces are constituted of the electron confinement surfaces.

3. The semiconductor element according to claim 1, wherein a gate part constituting the element structure of the tunnel field-effect transistor is arranged to cover all or part of at most three of the four constituent surfaces constituting the first opposing surfaces and the second opposing surfaces.

4. The semiconductor element according to claim 1, wherein a tunnel junction formed in the tunnel field-effect transistor is constituted of a semiconductor junction.

5. The semiconductor element according to claim 1, wherein the tunnel junction formed in the tunnel field-effect transistor is constituted of a Schottky junction.

6. A semiconductor integrated circuit comprising the semiconductor element according to claim 1.

7. A method for manufacturing the semiconductor element according to claim 1, comprising:

a channel part forming step of forming by an indirect transition-type semiconductor which is selected from the group consisting of silicon, germanium, a mixed crystal of silicon and germanium containing less than 85 atomic percent germanium and a mixed crystal of silicon and germanium containing 85 atomic percent or more of germanium, a channel part having a plate-like shaped portion having one end connected to a source part and the other end connected to a drain part, and forming, of two pairs of opposing surfaces of first opposing surfaces and second opposing surfaces which constitute the plate-like shaped portion and are opposed in a direction perpendicular to the direction in which a current flows from the source part to the drain part, at least one pair of the opposing surfaces selected from the two pairs by arranging at a facing interval of 15 nm at the longest between the opposing surfaces, electron confinement surfaces in which a band structure of a direct transition-type semiconductor is capable of being simulatively given to the indirect transition-type semiconductor by regulation of electron motion, wherein the electron confinement surface is constituted from any of the group consisting of a {100} plane of silicon, a {111} plane of germanium, a {100} plane of a mixed crystal of silicon and germanium containing less than 85 atomic percent germanium and a {111} plane of a mixed crystal of silicon and germanium containing 85 atomic percent or more of germanium, depending on the selection of the indirect transition-type semiconductor.

* * * * *